(12) United States Patent
Lee et al.

(10) Patent No.: US 8,865,600 B2
(45) Date of Patent: Oct. 21, 2014

(54) PATTERNED LINE END SPACE

(71) Applicant: Taiwan Semiconductor Manufacturing Company Limited, Hsin-Chu (TW)

(72) Inventors: Chia-Ying Lee, New Taipei (TW); Jyu-Horng Shieh, Hsin-Chu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/734,190

(22) Filed: Jan. 4, 2013

(65) Prior Publication Data
US 2014/0193980 A1 Jul. 10, 2014

(51) Int. Cl.
*H01L 21/31* (2006.01)
*H01L 21/02* (2006.01)

(52) U.S. Cl.
CPC ................................ *H01L 21/02274* (2013.01)
USPC ............................. 438/761; 438/637; 438/645

(58) Field of Classification Search
CPC .................. H01L 21/02164; H01L 21/31612; H01L 21/022; H01L 21/7685; H01L 21/7681
USPC ................. 438/734–738, 761, 624–638, 645; 257/E21.295, E21.027, E21.035
See application file for complete search history.

(56) References Cited

U.S. PATENT DOCUMENTS

| | | | | |
|---|---|---|---|---|
| 6,184,128 B1 * | 2/2001 | Wang et al. | ................... | 438/637 |
| 2009/0035665 A1 * | 2/2009 | Tran | ................................. | 430/5 |
| 2009/0170310 A1 * | 7/2009 | Jung | ............................. | 438/645 |

* cited by examiner

*Primary Examiner* — Reema Patel
*Assistant Examiner* — Syed Gheyas
(74) *Attorney, Agent, or Firm* — Cooper Legal Group, LLC

(57) ABSTRACT

One or more techniques or systems for forming a line end space structure are provided herein. In some embodiments, a first patterned second hard mask (HM) region is formed above a first HM region. In some embodiments, a first sacrificial HM region and a second sacrificial HM region are formed above at least one of the first patterned second HM region or the first HM region. Photo resist (PR) is patterned above the second sacrificial HM region, and a spacer region is deposited above the PR and second sacrificial HM region. In some embodiments, at least some of at least one of the spacer region, the PR, or the respective sacrificial HMs is removed. Accordingly, first patterned second hard mask (HM) region is patterned, thus forming the line end space structure associated with an end-to-end space.

20 Claims, 22 Drawing Sheets

PATTERNED LINE END SPACE

BACKGROUND

Generally, semiconductor devices are associated with one or more rows of metal lines. For example, a distance between a first metal line row and a second metal line row is associated with a run-to-run space. For another example, a distance between a one metal line of a row and another metal line in the same row is associated with an end-to-end space.

DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
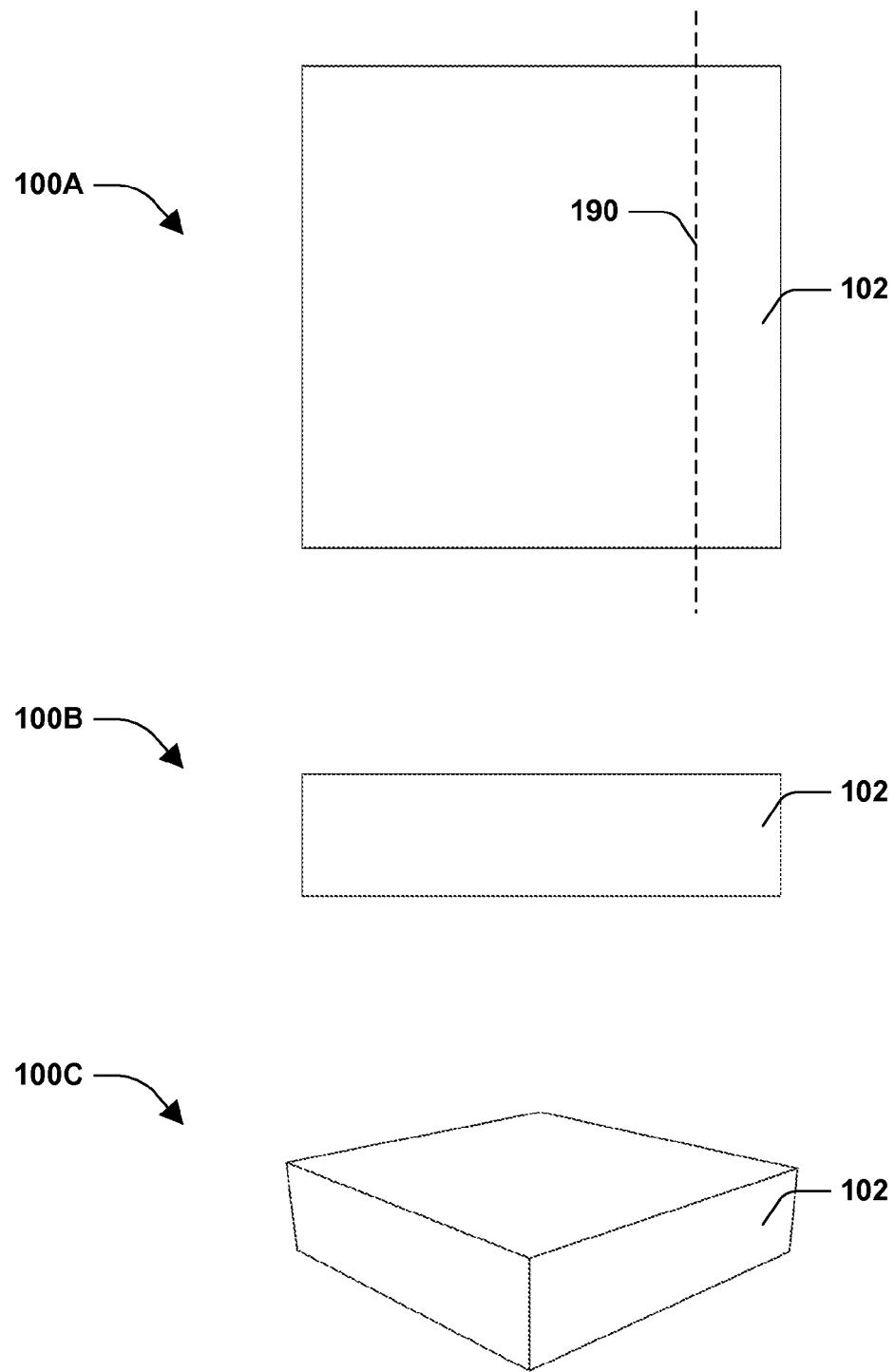
FIG. 1 illustrates various views of an example line end space structure during formation, according to some embodiments.

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

It will be appreciated that 'layer', as used herein, contemplates a region, and does not necessarily comprise a uniform thickness. For example, a layer is a region, such as an area comprising arbitrary boundaries. For another example, a layer is a region comprising at least some variation in thickness.

Figure 16:
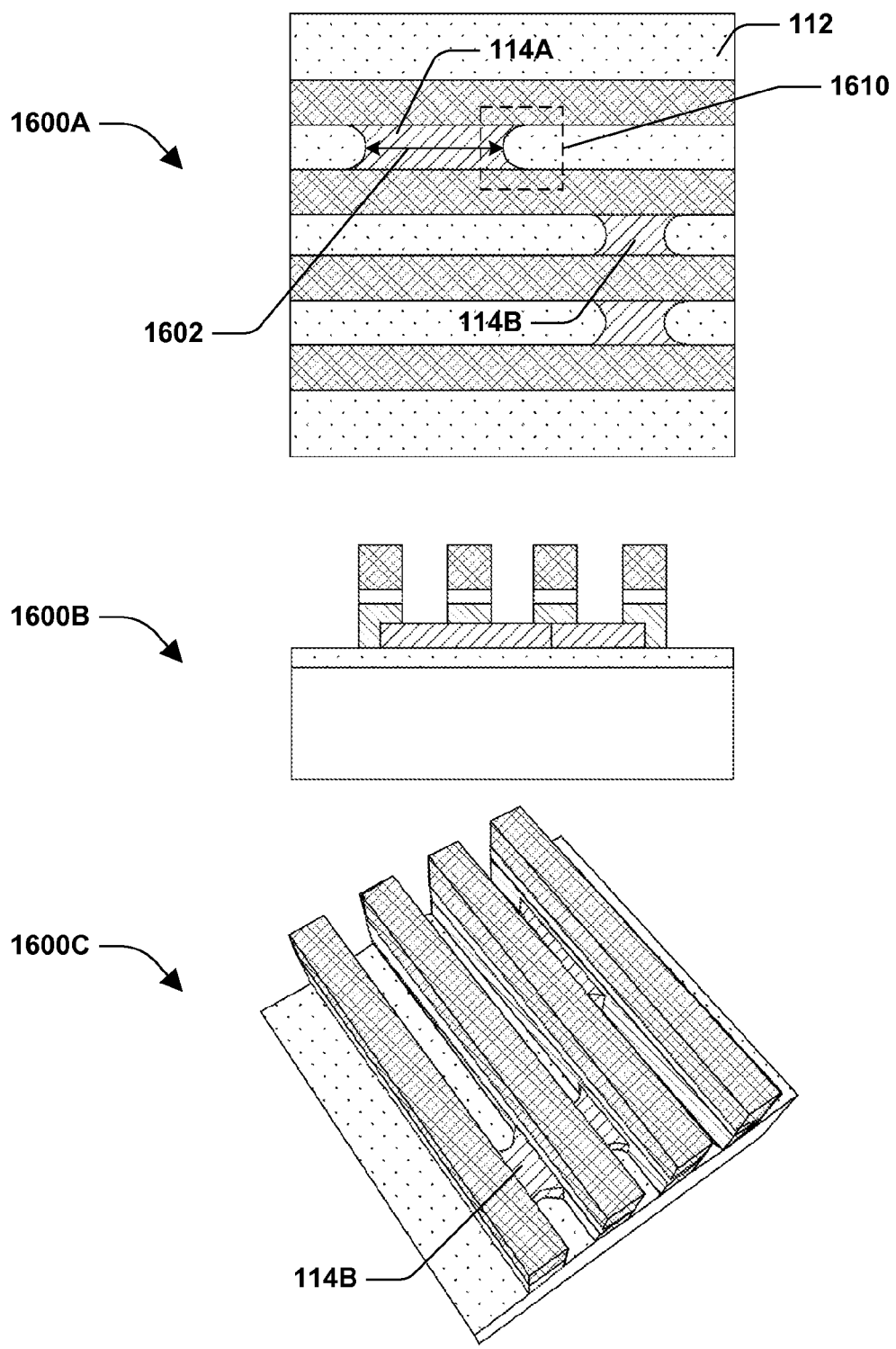
FIG. 16 illustrates various views of an example line end space structure during formation, according to some embodiments.

It will be appreciated that for at least some of the figures herein, one or more boundaries, such as boundary 1610 of FIG. 16, for example, are drawn with different heights, widths, perimeters, aspect ratios, etc. relative to the figure merely for illustrative purposes, and are not necessarily drawn to scale. For example, because dashed, dotted lines, or solid lines are used to represent different boundaries, if the dashed or dotted lines were drawn on top of the solid lines, they would not be distinguishable in the figures, and thus are drawn slightly apart from one another, in at least some of the figures, so that they are distinguishable from one another, for example. As another example, because a feature is associated with an irregular shape, such as a feature associated with 1610, a box drawn with a dashed line, dotted lined, etc. does not necessarily encompass the entire feature. Similarly, a drawn box does not necessarily encompass merely the associated feature, but encompasses at least some of one or more other features as well, in some embodiments. Accordingly, dimensions of some of these boundaries are drawn taller, shorter, wider, narrower, etc. than needed in some embodiments so that the different boundaries are visible in the figures, for example.

The following figures illustrate formation of an example line end space structure associated with semiconductor fabrication, according to some embodiments. It will be appreciated that the respective figures are described with reference to one another, such as with reference to a previous figure, for example.

Accordingly, FIG. 1 illustrates various views of an example line end space structure during formation, according to some embodiments. For example, 100A is a top-down view of an example line end space structure during formation, according to some embodiments. In some embodiments, a base region 102 is formed. Additionally, 100B is a cross-sectional view of an example line end space structure during formation, according to some embodiments. For example, the cross-sectional view 100B is associated with cross-section 190 of 100A. It will be appreciated that the cross-sectional views of figures herein are associated with similar cross-sections, for example. In some embodiments, 100B comprises the base region 102. In some embodiments, the base region 102 is formed based on at least one of chemical vapor deposition (CVD) or plasma enhanced chemical vapor deposition (PECVD). In some embodiments, the base region 102 comprises a dielectric, such as a low k (LK) dielectric material. Additionally, FIG. 100C is a perspective view of an example line end space structure during formation, according to some embodiments. For example, 100C is associated with the base region 102.

Figure 2:
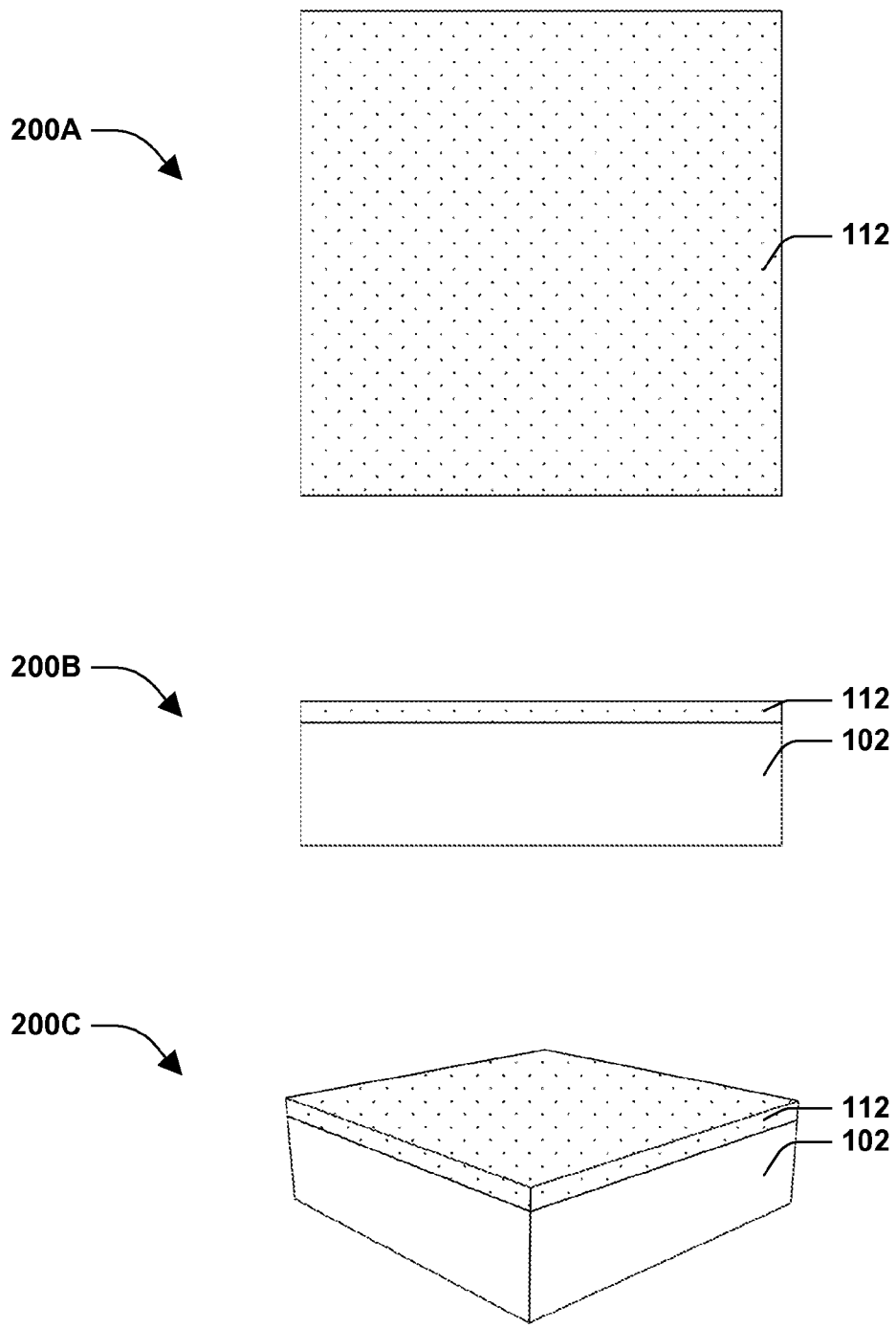
FIG. 2 illustrates various views of an example line end space structure during formation, according to some embodiments.

FIG. 2 illustrates various views of an example line end space structure during formation, according to some embodiments. For example, 200A is a top-down view of an example line end space structure during formation, according to some embodiments. For example, a first hard mask (HM) region 112 is formed above at least some of the base region 102. It will be appreciated that since 200A is a top-down view, the base region 102 is not visible, at least because the first HM region 112 is above the base region 102. Additionally, 200B is a cross-sectional view of an example line end space structure during formation, according to some embodiments. In some embodiments, the first HM region 112 is formed based on at least one of physical vapor deposition (PVD), CVD, or atomic layer deposition (ALD). Additionally, FIG. 200C is a perspective view of an example line end space structure during formation, according to some embodiments. For example, the first HM region 112 is deposited on the base region 102.

Figure 3:
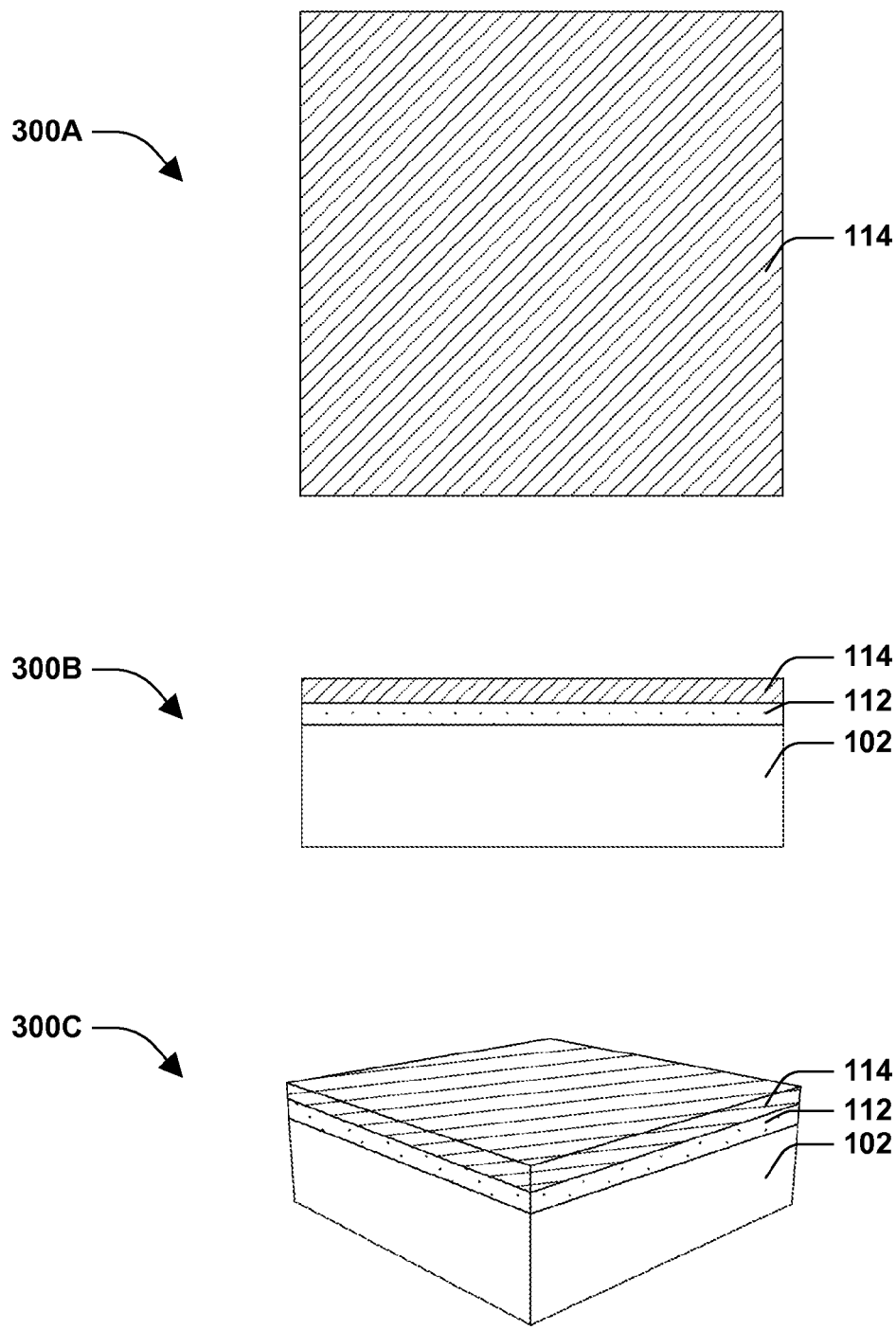
FIG. 3 illustrates various views of an example line end space structure during formation, according to some embodiments.

FIG. 3 illustrates various views of an example line end space structure during formation, according to some embodiments. For example, 300A is a top-down view of an example line end space structure during formation, according to some embodiments. In some embodiments, a second HM region 114 is formed above at least some of the first HM region 112. It will be appreciated that since 300A is a top-down view, the base region 102 and the first HM region 112 are not visible, at least because the second HM region 114 is above the first HM region 112 and the base region 102. Additionally, 300B is a cross-sectional view of an example line end space structure during formation, according to some embodiments. In some embodiments, the first HM region 112 is above the base region 102. In some embodiments, the second HM region 114 is above the first HM region 112. In some embodiments, the second HM region 114 is formed based on at least one of ALD, PVD, CVD, or PECVD, for example. Additionally, FIG. 300C is a perspective view of an example line end space structure during formation, according to some embodiments. In some embodiments, the second HM region 114 is deposited on the first HM region 112.

Figure 4:
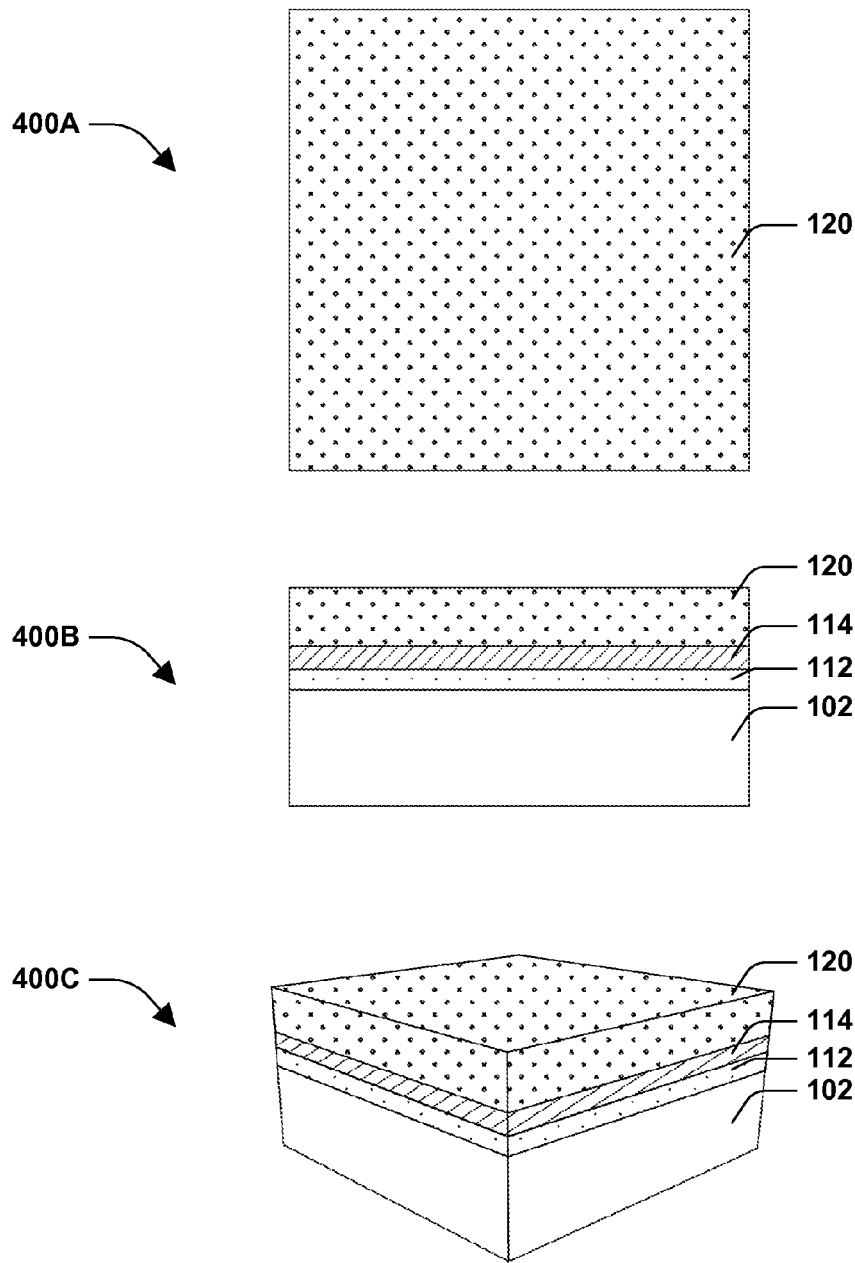
FIG. 4 illustrates various views of an example line end space structure during formation, according to some embodiments.

FIG. 4 illustrates various views of an example line end space structure during formation, according to some embodiments. For example, 400A is a top-down view of an example line end space structure during formation, according to some embodiments. In some embodiments, a first photo resist (PR) region 120 is formed above at least some of the second HM region 114. It will be appreciated that since 400A is a top-down view, underlying regions are not visible, at least because the first PR region 120 covers respective underlying regions. Additionally, 400B is a cross-sectional view of an example line end space structure during formation, according to some embodiments. For example, the first PR region 120 is above the second HM region 114. In some embodiments, the first PR region 120 is formed based on spin coating, such as spin coating the PR above the second HM region 114, for example. Additionally, FIG. 400C is a perspective view of an example line end space structure during formation, according to some embodiments.

Figure 5:
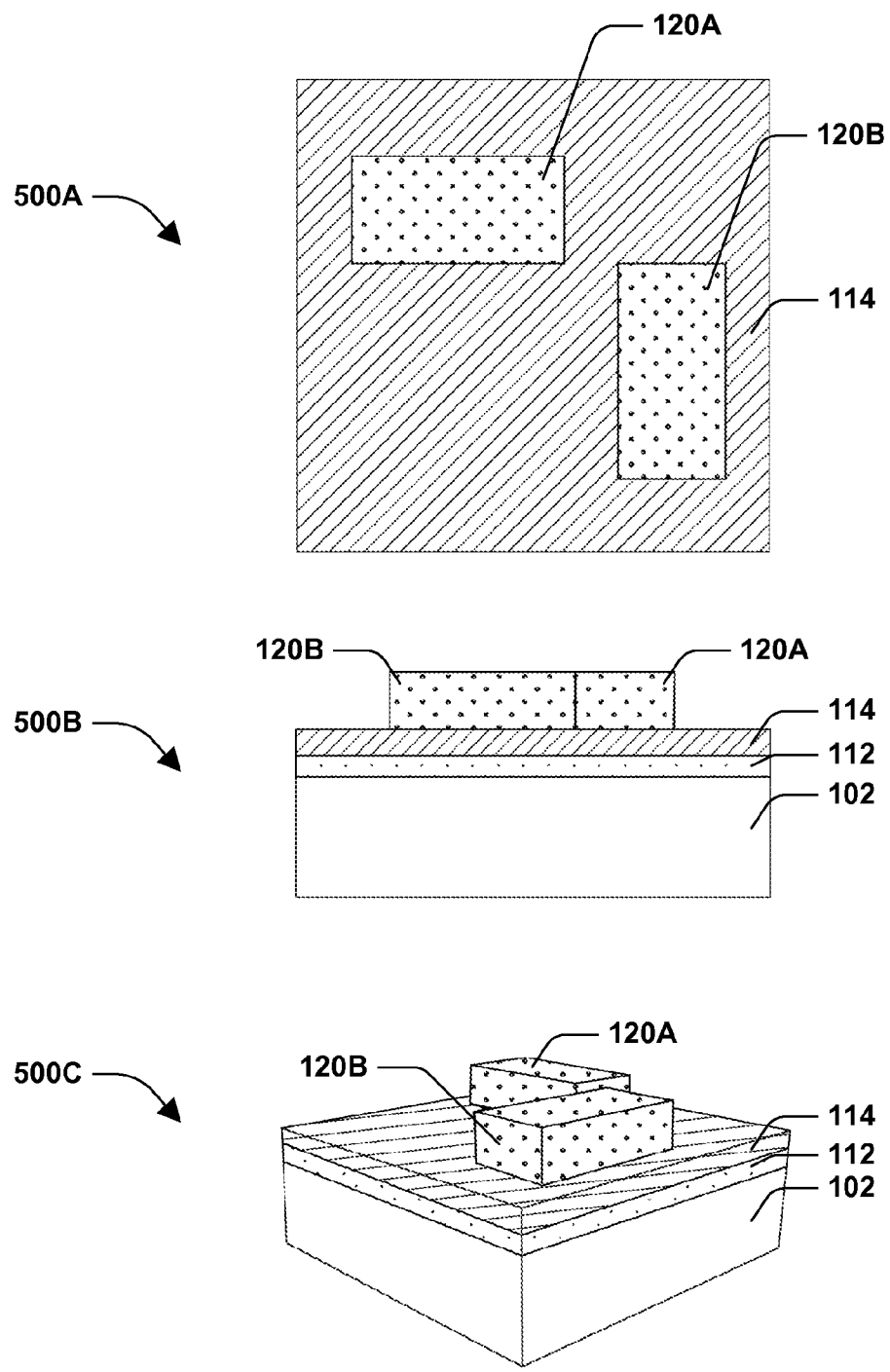
FIG. 5 illustrates various views of an example line end space structure during formation, according to some embodiments.

FIG. 5 illustrates various views of an example line end space structure during formation, according to some embodiments. For example, 500A is a top-down view of an example line end space structure during formation, according to some embodiments. In some embodiments, one or more patterned first PR regions are formed. In some embodiments, respective patterned first PR regions are associated with one or more pattern locations. For example, the first PR region 120 of 400A is patterned to form a first patterned first PR region 120A associated with a first pattern location, as will be described herein. In some embodiments, a pattern location is associated with one or more line locations. For example, the first pattern location of the first patterned first PR region 120A is associated with a first line location, as will be described herein. Similarly, a second patterned first PR region 120B is associated with a second pattern location by patterning the first PR region 120 of 400A. In some embodiments, the second pattern location of the second patterned first PR region 120B is associated with at least one of a second line location or a third line location, as will be described herein. In some embodiments, at least one of the first patterned first PR region 120A or the second patterned first PR region 120B is associated with an end-to-end (EE) space pattern for an end-to-end space structure. It will be appreciated that such EE space patterning is formed before spacer deposition, as will be described herein. Additionally, 500B is a cross-sectional view of an example line end space structure during formation, according to some embodiments. In some embodiments, at least one of the first patterned first PR region 120A or the second patterned first PR region 120B is formed above at least some of the second HM region 114. Additionally, FIG. 500C is a perspective view of an example line end space structure during formation, according to some embodiments. It will be appreciated that the first patterned first PR region 120A is associated with a first line end space structure configured to separate a first metal line from a second metal line. Similarly, the second patterned first PR region 120B is associated with a second line end space structure configured to separate one or more metal lines into one or more portions. In some embodiments, the first PR region 120 of FIG. 4 comprises at least one of the first patterned first PR region 120A or the second patterned first PR region 120B.

Figure 6:
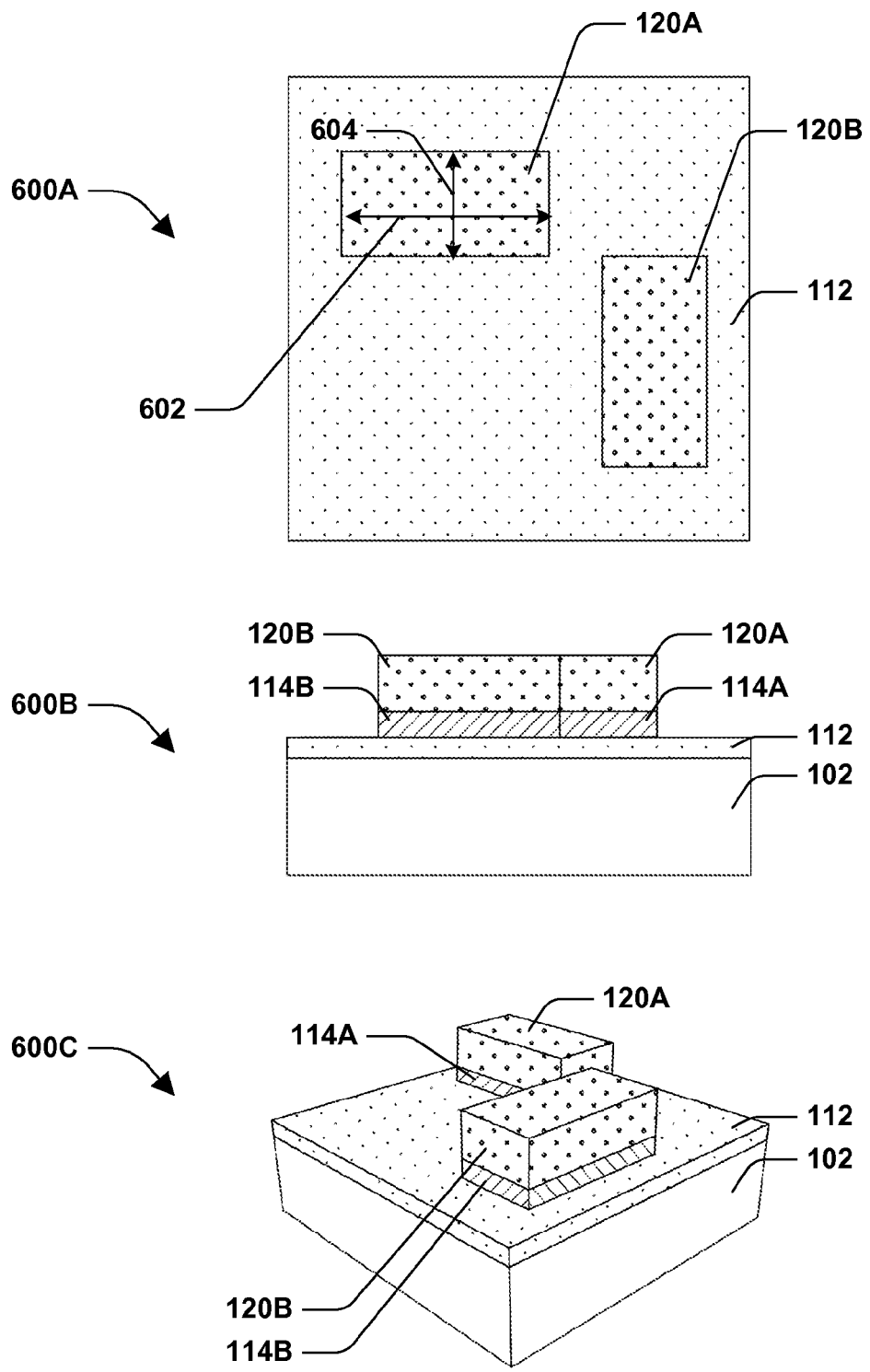
FIG. 6 illustrates various views of an example line end space structure during formation, according to some embodiments.

FIG. 6 illustrates various views of an example line end space structure during formation, according to some embodiments. For example, 600A is a top-down view of an example line end space structure during formation, according to some embodiments. In some embodiments, a patterned first PR region, such as the first patterned first PR region 120A comprises a width 604 associated with a distance greater than a width of a metal line, such as a width indicated by 1906 of FIG. 19, for example, and a length 602 associated with an end-to-end (EE) space for a corresponding line end space structure. It will be appreciated that in some embodiments, width 604 is associated with a distance such that the first patterned first PR region 120A does not overlap neighboring metal lines, such as a corresponding area between 150B and 150C of FIG. 19, for example. In some embodiments, a patterned PR region, such as the first patterned first PR region 120A is associated with an overlay window. In some embodiments, one or more patterned second HM regions are formed. In some embodiments, respective patterned second HM regions are associated with respective pattern locations of patterned first PR regions. In some embodiments, respective patterned second HM regions are formed based on respective patterned first PR regions. For example, a first patterned second HM region 114A is formed. In some embodiments, the first patterned second HM region 114A is formed based on the first patterned first PR region 120A. In some embodiments, the first patterned second HM region 114A is associated with the first pattern location of the first patterned first PR region 120A. It will be appreciated that a second patterned second HM region 114B is formed in a similar manner. For example, the second patterned second HM region 114B is associated with the second pattern location of the second patterned first PR region 120B. In some embodiments, at least one of the first patterned second HM region 114A or the second patterned second HM region 114B is not visible, at least because at least one of the first patterned first PR region 120A or the second patterned first PR region 120B are above respective patterned second HM regions 114A and 114B. Additionally, 600B is a cross-sectional view of an example line end space structure during formation, according to some embodiments. Additionally, FIG. 600C is a perspective view of an example line end space structure during formation, according to some embodiments. It will be appreciated that the first patterned second HM region 114A is associated with a first line end space structure configured to separate a first metal line from a second metal line. Similarly, the second patterned second HM region 114B is associated with a second line end space structure configured to separate one or more metal lines into one or more portions. In some embodiments, the second HM region 114 of FIG. 5 comprises at least one of the first patterned second HM region 114A or the second patterned second HM region 114B.

Figure 7:
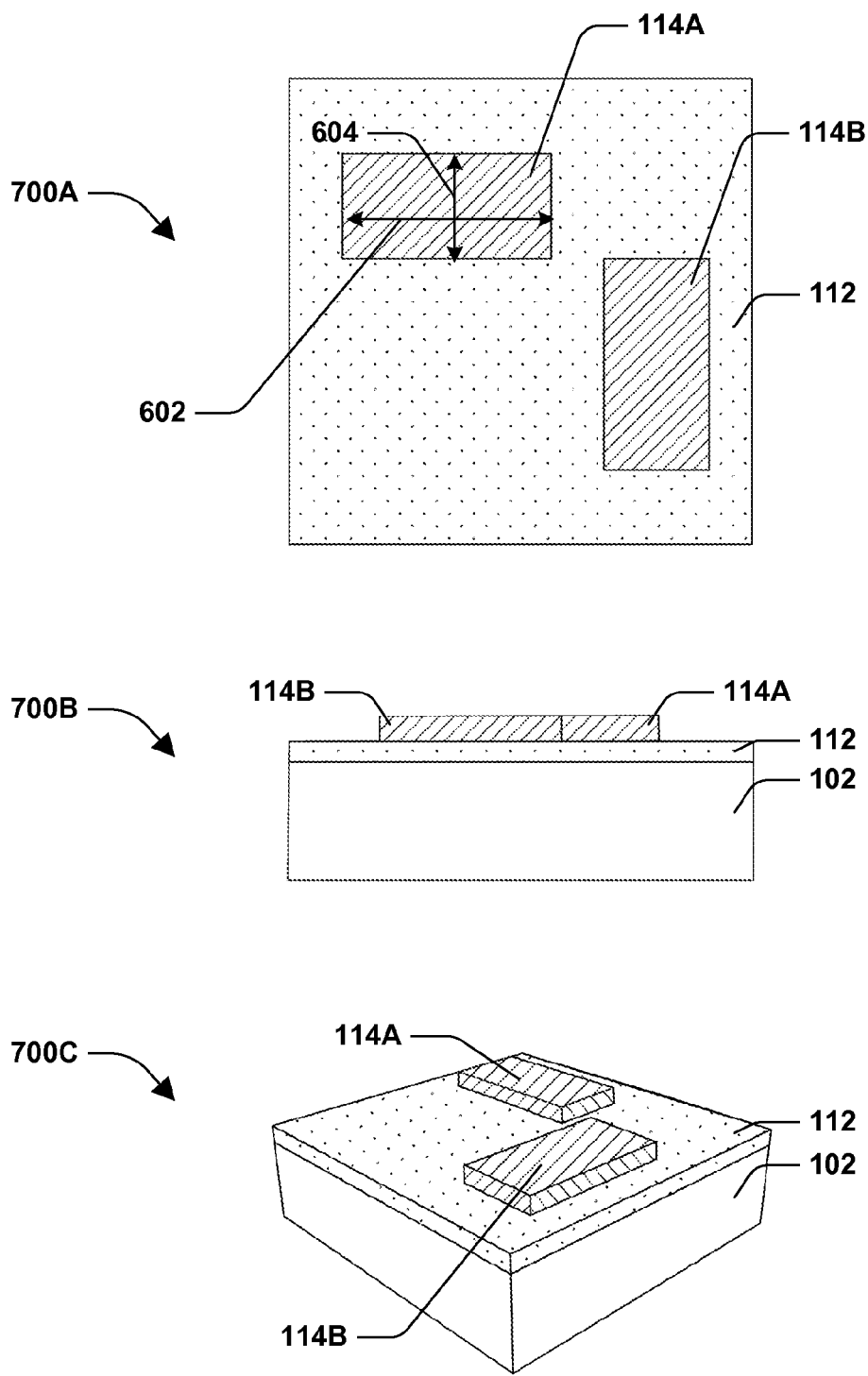
FIG. 7 illustrates various views of an example line end space structure during formation, according to some embodiments.

FIG. 7 illustrates various views of an example line end space structure during formation, according to some embodiments. For example, 700A is a top-down view of an example line end space structure during formation, according to some embodiments. In some embodiments, a patterned second HM region, such as the first patterned second HM region 114A comprises a width 604 associated with a distance greater than a width of a metal line, such as a width indicated by 1906 of FIG. 19, for example, and a length 602 associated with an end-to-end (EE) space for a corresponding line end space structure. It will be appreciated that in some embodiments, width 604 is associated with a distance such that the first patterned first PR region 120A does not overlap neighboring metal lines, such as a corresponding area between 150B and 150C of FIG. 19, for example. In some embodiments, a patterned PR region, such as the first patterned first PR region 120A is associated with an overlay window. In some embodiments, the width 604 and length 602 are the same as the width 604 and length 602 of the first patterned first PR region 120A of FIG. 6. In some embodiments, one or more patterned first PR regions are removed. Accordingly, one or more patterned second HM regions are exposed. For example, at least one of the first patterned second HM region 114A or the second patterned second HM region 114B is exposed. Additionally, 700B is a cross-sectional view of an example line end space structure during formation, according to some embodiments. For example, at least one of the first patterned second HM region 114A or the second patterned second HM region 114B is above the first HM region 112. Additionally, FIG. 700C is a perspective view of an example line end space structure during formation, according to some embodiments. It will be appreciated that the first patterned second HM region 114A is patterned before spacer deposition, at least because the line end space structure is formed based on self aligned multiple patterning. For example, the first patterned second HM region 114A is aligned with one or more line locations for one or more metal lines.

Figure 8:
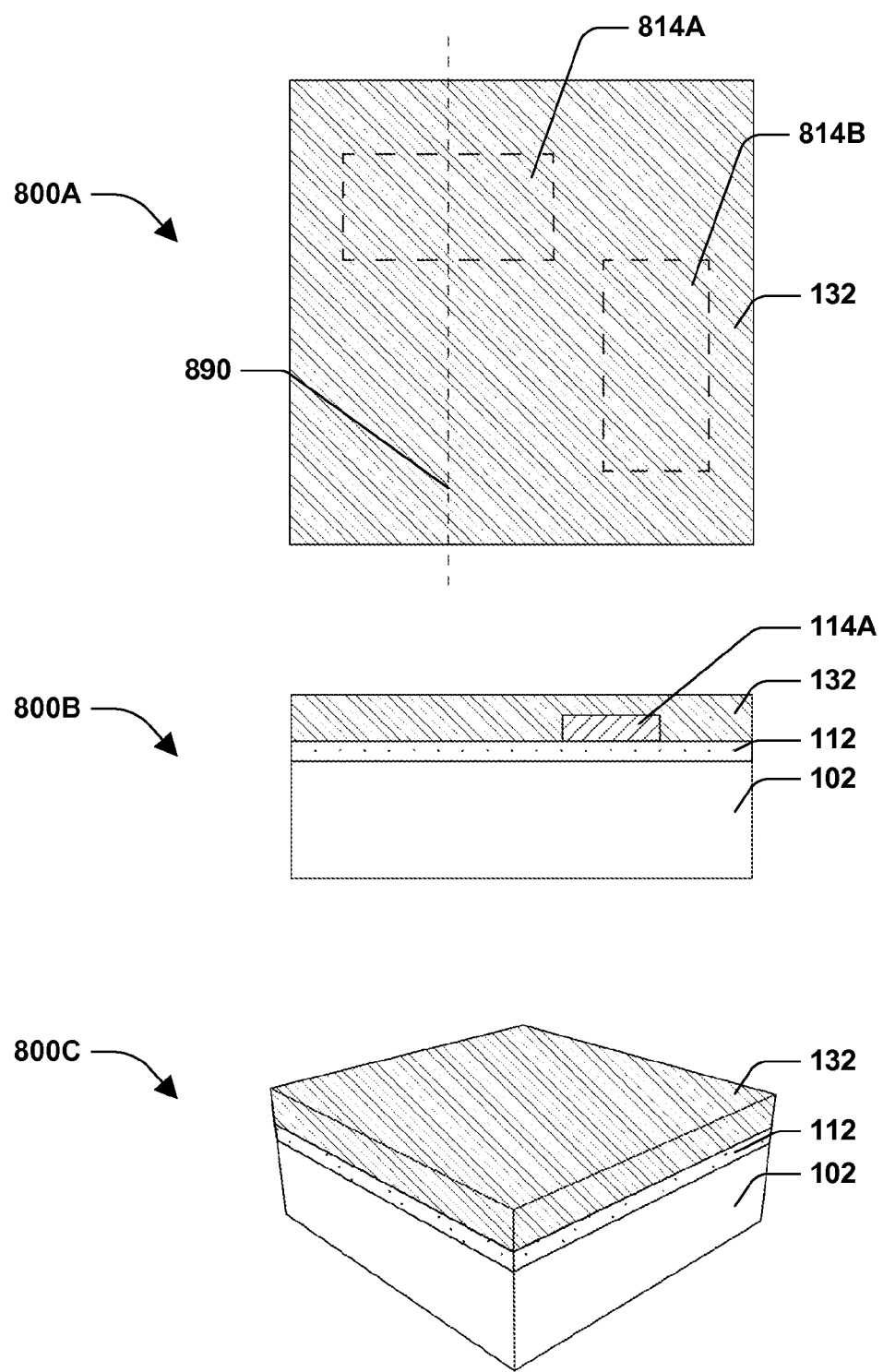
FIG. 8 illustrates various views of an example line end space structure during formation, according to some embodiments.

FIG. 8 illustrates various views of an example line end space structure during formation, according to some embodiments. For example, 800A is a top-down view of an example line end space structure during formation, according to some embodiments. In some embodiments, a first sacrificial HM region 132 is formed above at least some of at least one of the first HM region 112 or at least one of the patterned second HM regions. For example, a first sacrificial HM region 132 is formed above at least some the first patterned second HM region 114A. In some embodiments, the first sacrificial HM region 132 is formed above at least some of the second patterned second HM region 114B. In some embodiments, the first sacrificial HM region 132 is formed to surround at least some of the first patterned second HM region 114A. In some embodiments, at least one of the first patterned first PR region 120A or the first patterned second HM region 114A is associated with a first pattern location 814A. Similarly, at least one of the second patterned first PR region 120B or the second patterned second HM region 114B is associated with a second pattern location 814B. Additionally, 800B is a cross-sectional view of an example line end space structure during formation, according to some embodiments. For example, the cross-sectional view 800B is associated with cross-section 890 of 800A. Accordingly, the first HM region 112 is above the base region 102. In some embodiments, the first patterned second HM region 114A is above the first HM region 112. In some embodiments, a first sacrificial HM region 132 is formed at least one of above or surrounding at least some of the first patterned second HM region 114A. It will be appreciated that the second patterned second HM region 114B is not visible in 800B, at least because cross-section 890 does not intersect 814B. In some embodiments, the first sacrificial HM region 132 is formed based on at least one of spin coating, CVD, or PECVD. Additionally, FIG. 800C is a perspective view of an example line end space structure during formation, according to some embodiments. It will be appreciated that at least one of the first patterned second HM region 114A or the second patterned second HM region 114B is not visible in 800C, at least because respective second HM regions 114A and 114B are encased within the first sacrificial HM region 132.

Figure 9:
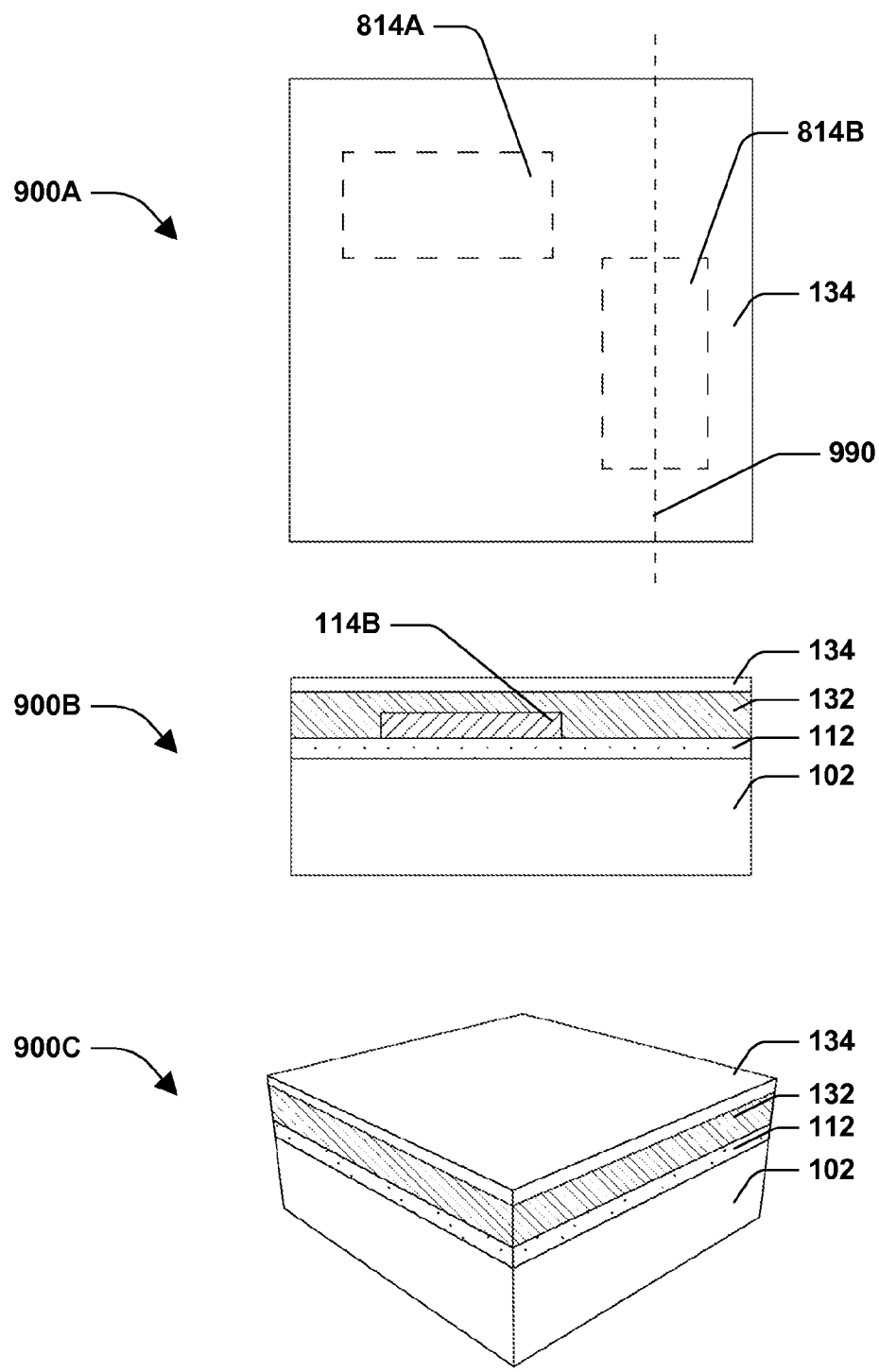
FIG. 9 illustrates various views of an example line end space structure during formation, according to some embodiments.

FIG. 9 illustrates various views of an example line end space structure during formation, according to some embodiments. For example, 900A is a top-down view of an example line end space structure during formation, according to some embodiments. In some embodiments, a second sacrificial HM region 134 is formed above at least some of the first sacrificial HM region 132. Additionally, 900B is a cross-sectional view of an example line end space structure during formation, according to some embodiments. For example, the cross-sectional view 900B is associated with cross-section 990 of 900A. It will be appreciated that the first patterned second HM region 114A is not visible in 900B, at least because cross-section 990 does not intersect 814A. In some embodiments, the second sacrificial HM region 134 is formed based on at least one of spin coating, CVD, or ALD. Additionally, FIG. 900C is a perspective view of an example line end space structure during formation, according to some embodiments.

Figure 10:
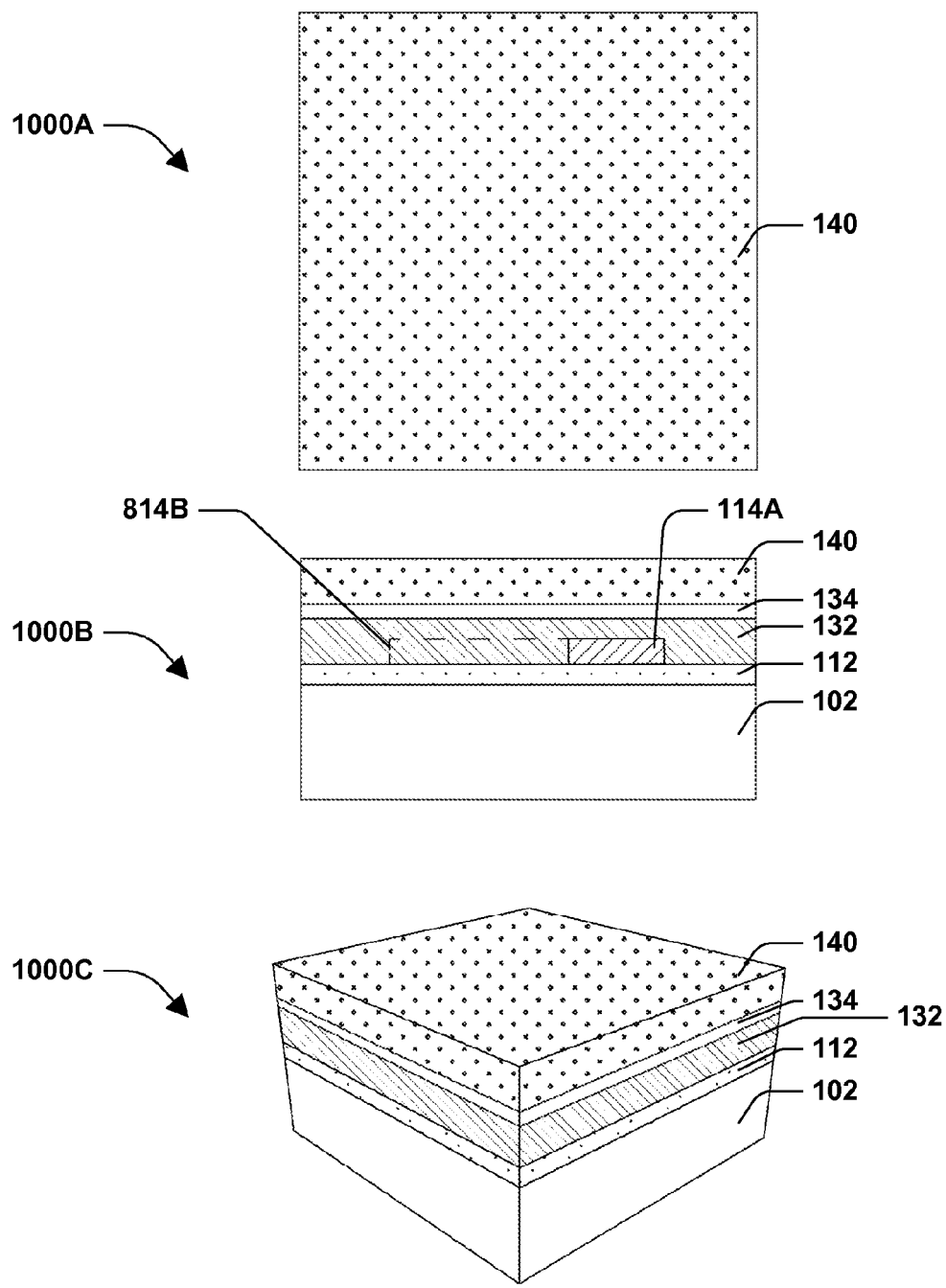
FIG. 10 illustrates various views of an example line end space structure during formation, according to some embodiments.

FIG. 10 illustrates various views of an example line end space structure during formation, according to some embodiments. For example, 1000A is a top-down view of an example line end space structure during formation, according to some embodiments. In some embodiments, a second PR region 140 is formed above at least some of the second sacrificial HM region 134. Additionally, 1000B is a cross-sectional view of an example line end space structure during formation, according to some embodiments. It will be appreciated that FIGS. 10-14 are associated with cross-sections similar to cross-section 890 of FIG. 8. Accordingly, the first patterned second HM region 114A is outlined with a solid line, while the second patterned second HM region 114B is not visible, but is indicated by dashed outline of the second pattern location 814B. In some embodiments, the first HM region 112 is above at least some of the base region 102, at least one of the first patterned second HM region 114A or the second patterned second HM region 114B is above at least some of the first HM region 112, the first sacrificial HM region 132 is formed at least one of above or surrounding at least some of at least one of the first patterned second HM region 114A or the second patterned second HM region 114B, the second sacrificial HM region 134 is above at least some of the first sacrificial HM region 132, and the second PR region 140 is above at least some of the second sacrificial HM region 134. Additionally, FIG. 1000C is a perspective view of an example line end space structure during formation, according to some embodiments.

Figure 11:
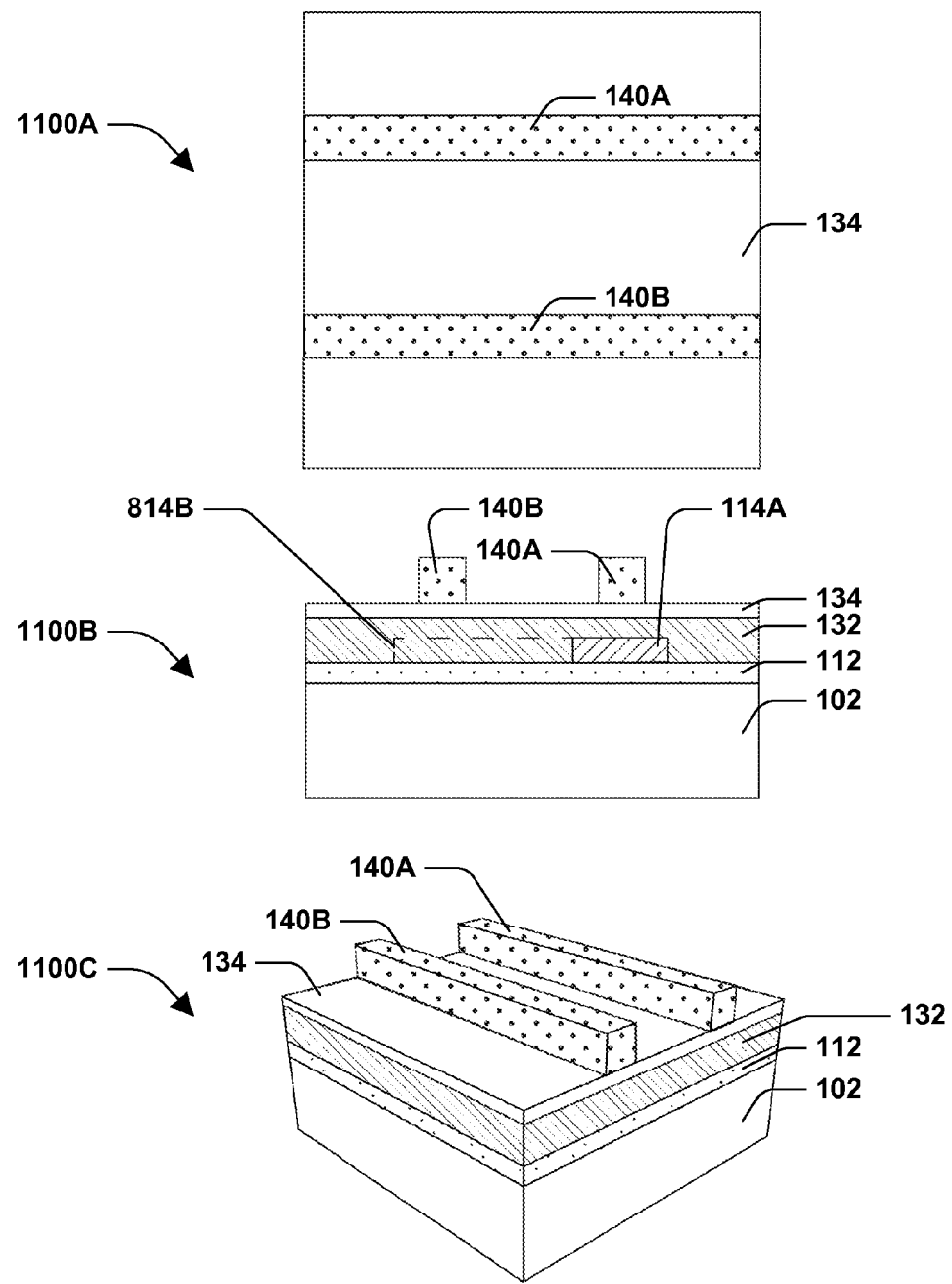
FIG. 11 illustrates various views of an example line end space structure during formation, according to some embodiments.

FIG. 11 illustrates various views of an example line end space structure during formation, according to some embodiments. For example, 1100A is a top-down view of an example line end space structure during formation, according to some embodiments. In some embodiments, the second PR region 140 is patterned to form one or more patterned second PR regions. In some embodiments, respective patterned second PR regions are associated with one or more line locations. For example, the second PR region 140 is patterned to form at least one of a first patterned second PR region 140A or a second patterned second PR region 140B. In some embodiments, the first patterned second PR region 140A is associated with a first line location and the second patterned second PR region 140B is associated with a second line location. For example, the first patterned second PR region 140A is above the first line location and the second patterned second PR region 140B is above the second line location. In some embodiments, at least some of the second sacrificial HM region 134 is exposed upon removal of at least some of the second PR region 140. Additionally, 1100B is a cross-sectional view of an example line end space structure during formation, according to some embodiments. For example, the first patterned second PR region 140A is formed above the first line location and above at least some of the second sacrificial HM region 134 and the second patterned second PR region 140B is formed above the second line location and above at least some of the second sacrificial HM region 134. Additionally, FIG. 1100C is a perspective view of an example line end space structure during formation, according to some embodiments. In some embodiments at least one of the first patterned second PR region 140A or the second patterned second PR region 140B is formed by forming a second PR region 140 above at least some of the second sacrificial HM region 134 and patterning the second PR region 140 to form at least one of the first patterned second PR region 140A or the second patterned second PR region 140B.

Figure 12:
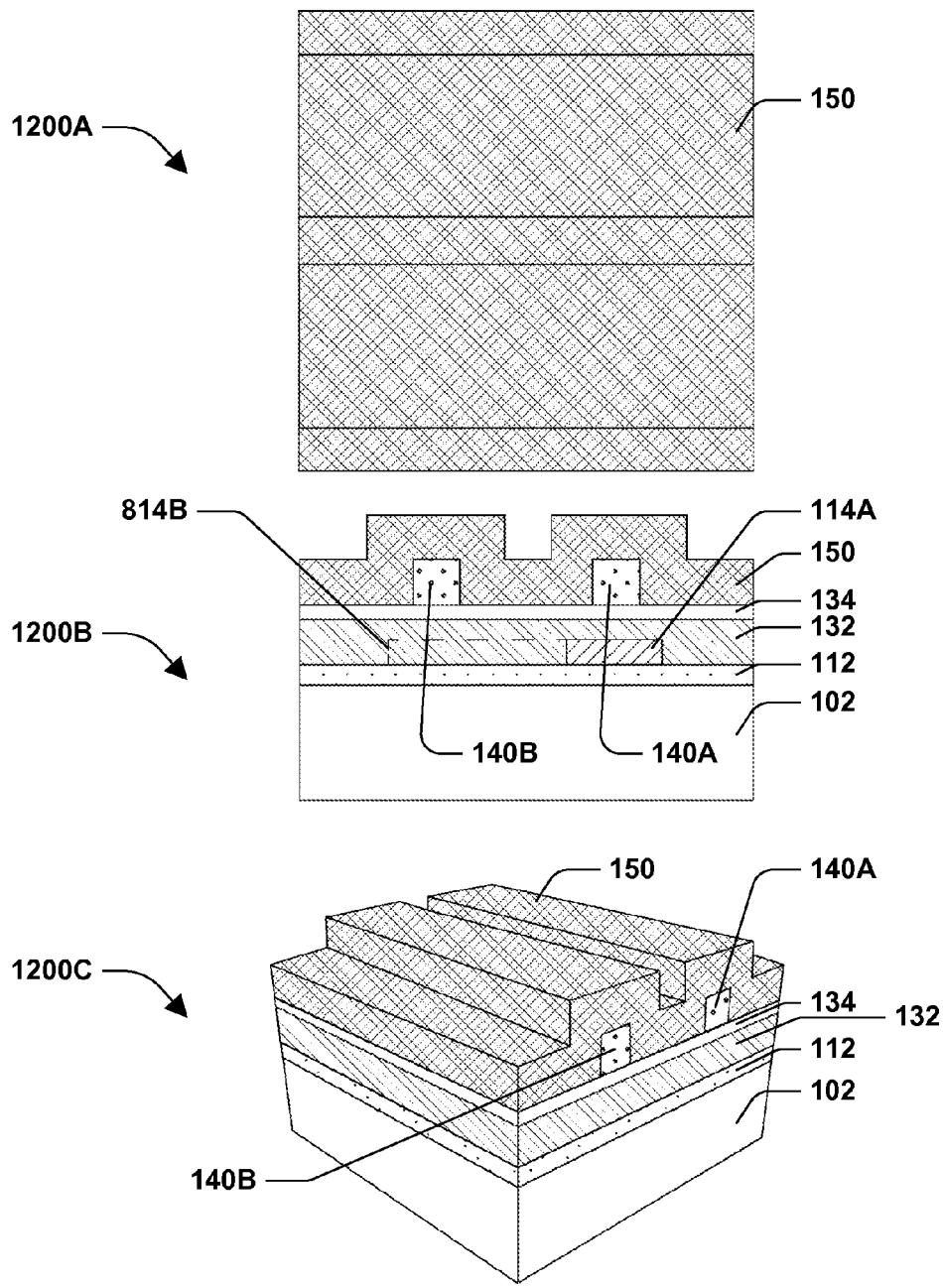
FIG. 12 illustrates various views of an example line end space structure during formation, according to some embodiments.

FIG. 12 illustrates various views of an example line end space structure during formation, according to some embodiments. For example, 1200A is a top-down view of an example line end space structure during formation, according to some embodiments. In some embodiments, a spacer region 150 is formed above at least some of at least one of the second sacrificial HM region 134 or at least one of the patterned second PR regions. For example, the spacer region 150 is formed above at least some of at least one of the first patterned second PR region 140A, the second patterned second PR region 140B, or the second sacrificial HM region 134. Additionally, 1200B is a cross-sectional view of an example line end space structure during formation, according to some embodiments. In some embodiments, the spacer region 150 is formed based on at least one of ALD or CVD. Additionally, FIG. 1200C is a perspective view of an example line end space structure during formation, according to some embodiments. It will be appreciated that the spacer region 150 is formed to surround at least some of at least one of the first patterned second PR region 140A or the second patterned second PR region 140B.

Figure 13:
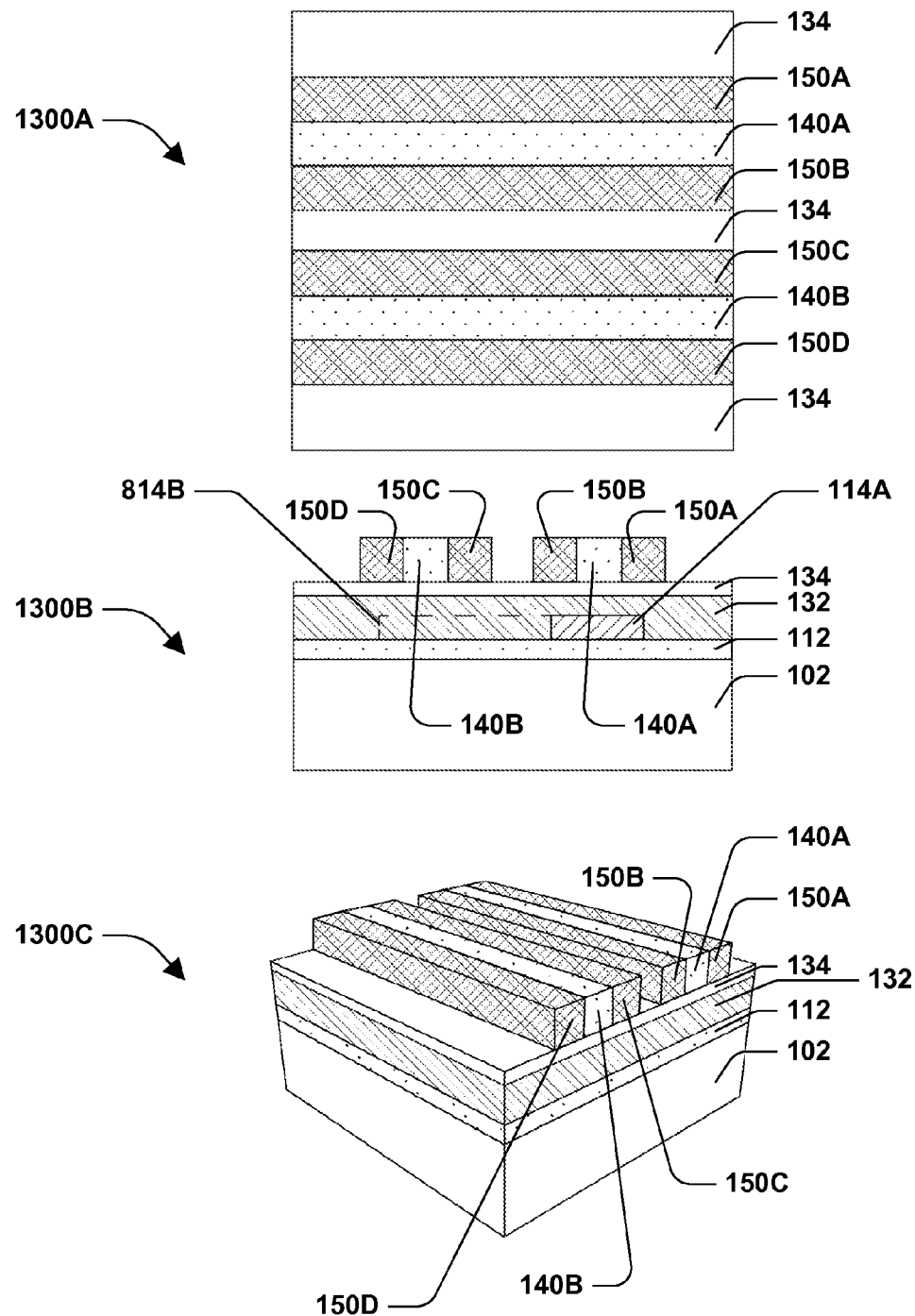
FIG. 13 illustrates various views of an example line end space structure during formation, according to some embodiments.

FIG. 13 illustrates various views of an example line end space structure during formation, according to some embodiments. For example, 1300A is a top-down view of an example line end space structure during formation, according to some embodiments. In some embodiments, at least some of the spacer region 150 between at least some of the patterned second PR regions is removed. For example, at least some of the spacer region 150 between the first patterned second PR region 140A and the second patterned second PR region 140B is removed and associated with a third line location. For example, the removed spacer region 150 between the first patterned second PR region 140A and the second patterned second PR region 140B is above the third line location. In some embodiments, at least some of the spacer region 150 associated with a third line location is removed. For example, the third line location is between the first patterned second PR region 114A and the second patterned second PR region 114B. In some embodiments, at least some of the spacer region 150 above at least some of the patterned second PR regions is removed. For example, the spacer region 150 above at least one of the first patterned second PR region 140A or the second patterned second PR region 140B is removed such that the spacer region 150 is flush with the second PR regions 140A and 140B. Additionally, 1300B is a cross-sectional view of an example line end space structure during formation, according to some embodiments. In some embodiments, the first patterned second PR region 140A is between a first patterned spacer region 150A and a second patterned spacer region 150B. In some embodiments, the second patterned second PR region 140B is between a third patterned spacer region 150C and a fourth patterned spacer region 150D. In some embodiments, the spacer region 150 of FIG. 12 comprises the patterned spacer regions 150A, 150B, 150C, and 150D, for example. In some embodiments, a gap associated with a third line location is between the second patterned spacer region 150B and the third patterned spacer region 150C. For example, the gap is above the third line location. Additionally, FIG. 1300C is a perspective view of an example line end space structure during formation, according to some embodiments.

Figure 14:
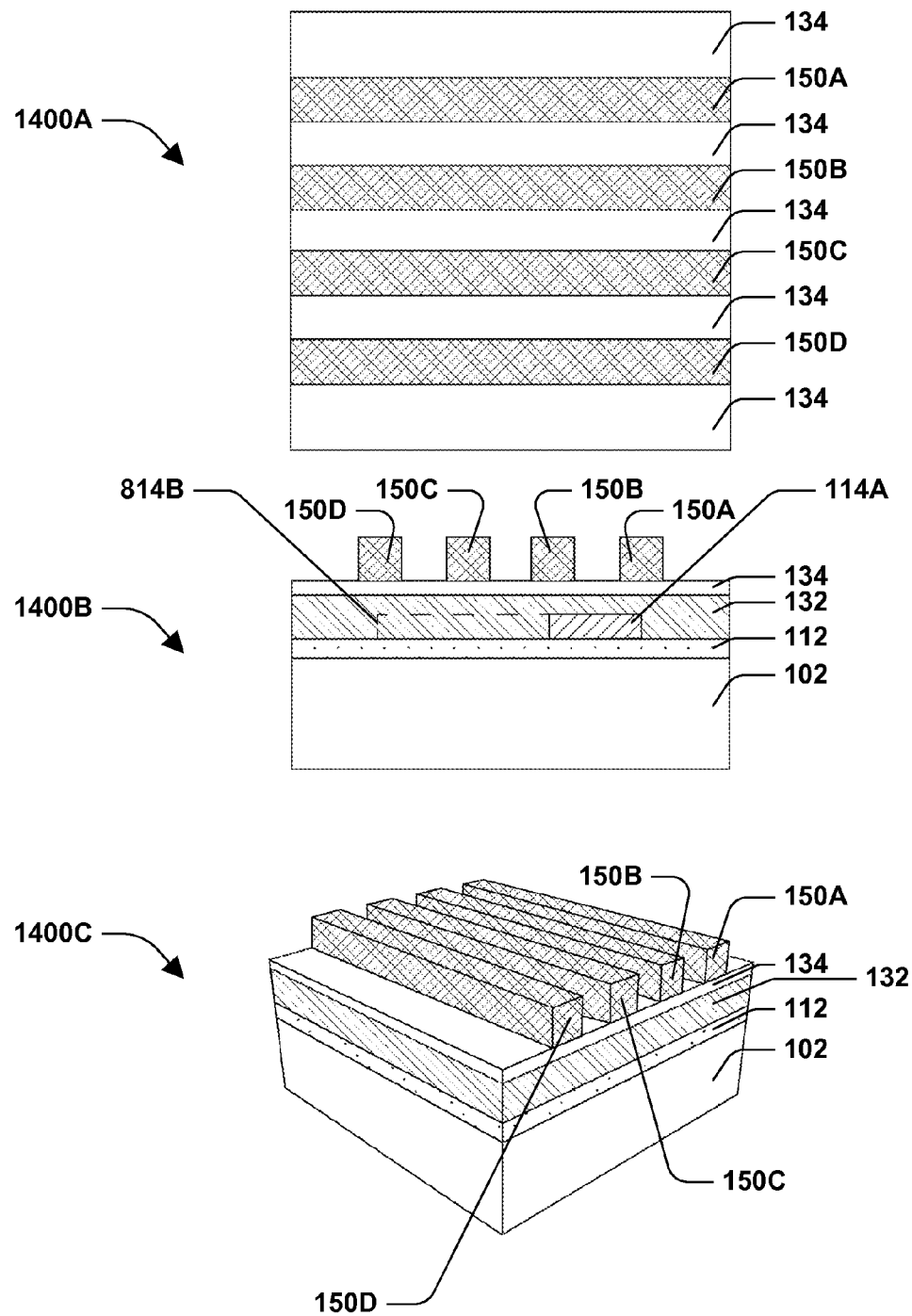
FIG. 14 illustrates various views of an example line end space structure during formation, according to some embodiments.

FIG. 14 illustrates various views of an example line end space structure during formation, according to some embodiments. For example, 1400A is a top-down view of an example line end space structure during formation, according to some embodiments. In some embodiments, at least some of the patterned second PR regions are removed. For example, at least one of the first patterned second PR region 140A or the second patterned second PR region 140B is removed. In this way, the spacer region 150 and the second sacrificial HM region 134 are exposed. In some embodiments, the spacer region comprises a first patterned spacer region 150A, a second patterned spacer region 150B, a third patterned spacer region 150C, and a fourth patterned spacer region 150D. It will be appreciated that respective patterned spacer regions are associated with a run-to-run space between one or more rows of metal lines, in some embodiments. For example, respective patterned spacer regions are associated with separating one or more rows of metal lines. Additionally, 1400B is a cross-sectional view of an example line end space structure during formation, according to some embodiments. Additionally, FIG. 1400C is a perspective view of an example line end space structure during formation, according to some embodiments.

Figure 15:
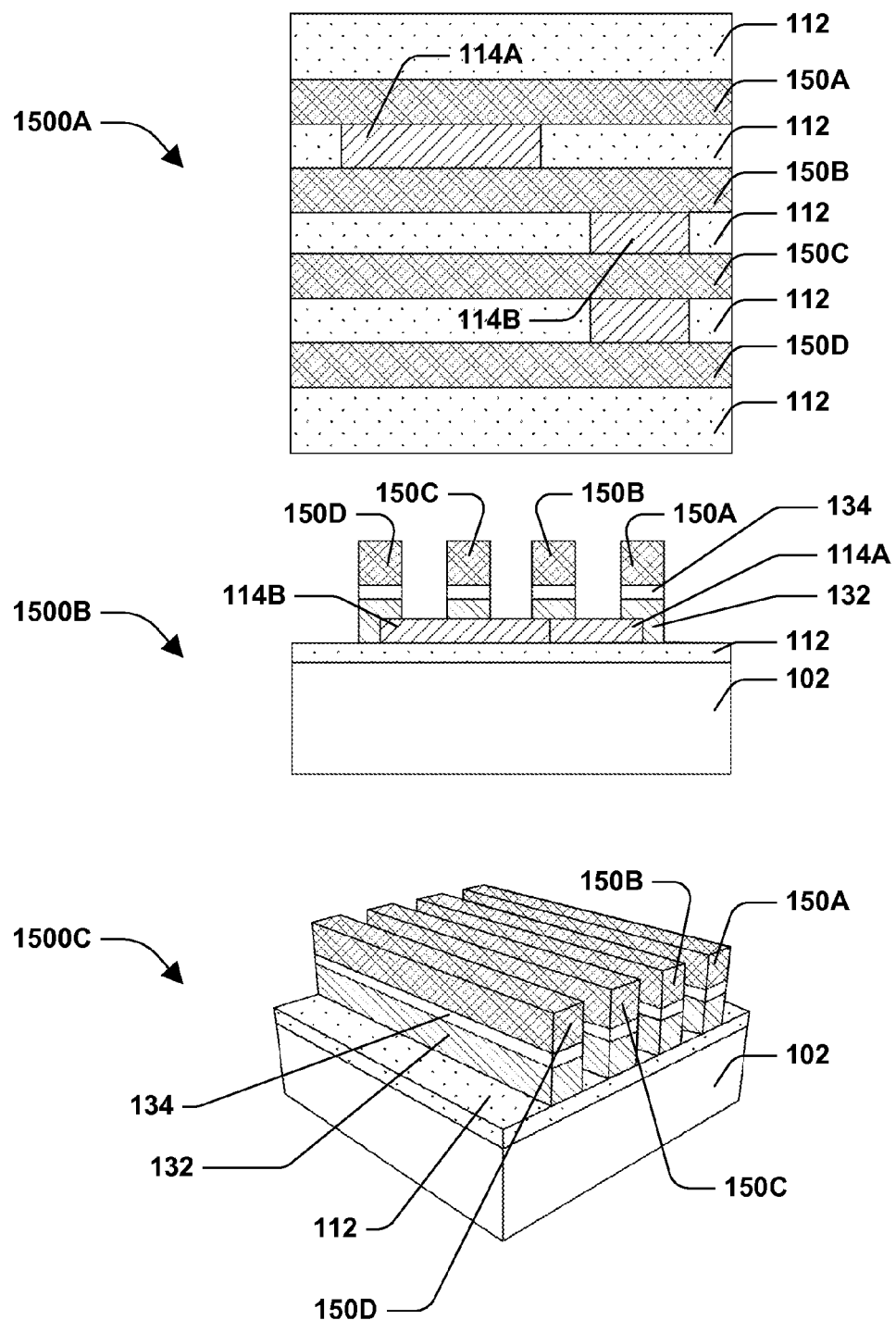
FIG. 15 illustrates various views of an example line end space structure during formation, according to some embodiments.

FIG. 15 illustrates various views of an example line end space structure during formation, according to some embodiments. For example, 1500A is a top-down view of an example line end space structure during formation, according to some embodiments. In some embodiments, at least some of the second sacrificial HM region 134 not associated with the spacer region 150 is removed. In some embodiments, at least some of the first sacrificial HM region 132 not associated with the spacer region 150 is removed. For example, a first patterned spacer region 150A, a second patterned spacer region 150B, a third patterned spacer region 150C, and a fourth patterned spacer region 150D cover one or more portions of at least one of the second sacrificial HM region 134 or the first sacrificial HM region 132. Accordingly, such covered portions are thus not removed. In this way, at least one of the first patterned second HM region 114A, the second patterned second HM region 114B, the first HM region 112, and the spacer region 150 are exposed. It will be appreciated that in some embodiments, the spacer region 150 comprises the first patterned spacer region 150A, the second patterned spacer region 150B, the third patterned spacer region 150C, and the fourth patterned spacer region 150D. Additionally, 1500B is a cross-sectional view of an example line end space structure during formation, according to some embodiments. In some embodiments, one or more stacks are formed. For example, a first stack is associated with the first patterned spacer region 150A. In some embodiments, the first stack is associated with the first patterned spacer region 150A above the second sacrificial HM region 134, the second sacrificial HM region 134 above the first sacrificial HM region 132, and at least some of the first sacrificial HM region 132 above at least some of the first patterned second HM region 114A. Additionally, FIG. 1500C is a perspective view of an example line end space structure during formation, according to some embodiments.

FIG. 16 illustrates various views of an example line end space structure during formation, according to some embodiments. For example, 1600A is a top-down view of an example line end space structure during formation, according to some embodiments. In some embodiments, at least some of at least one of the patterned second HM regions is removed. For example, a portion 1610 associated with the first patterned second HM region 114A is removed. In this way, a length 1602 associated with the first patterned second HM region 114A is reduced. In some embodiments, length 1602 is less than length 602 of FIG. 7, for example. Accordingly, since the length 1602 of the first patterned second HM region 114A is reduced, a line end space structure associated with the first patterned second HM region 114A is reduced. For example, the length 1602 of the first patterned second HM region 114A is less than one hundred nanometers, such as fifty nanometers. Additionally, 1600B is a cross-sectional view of an example line end space structure during formation, according to some embodiments. In some embodiments, removing at least some of at least one of the patterned second HM regions reduces a thickness (not shown) of a patterned second HM region. For example, at least some of the first patterned second HM region 114A is removed based on an anisotropic etch. In this way, a thickness associated with the first patterned second HM region 114A is reduced and a length 1602 associated with the first patterned second HM region 114A is reduced, such as by removing a portion associated with 1610, for example. Additionally, FIG. 1600C is a perspective view of an example line end space structure during formation, according to some embodiments.

Figure 17:
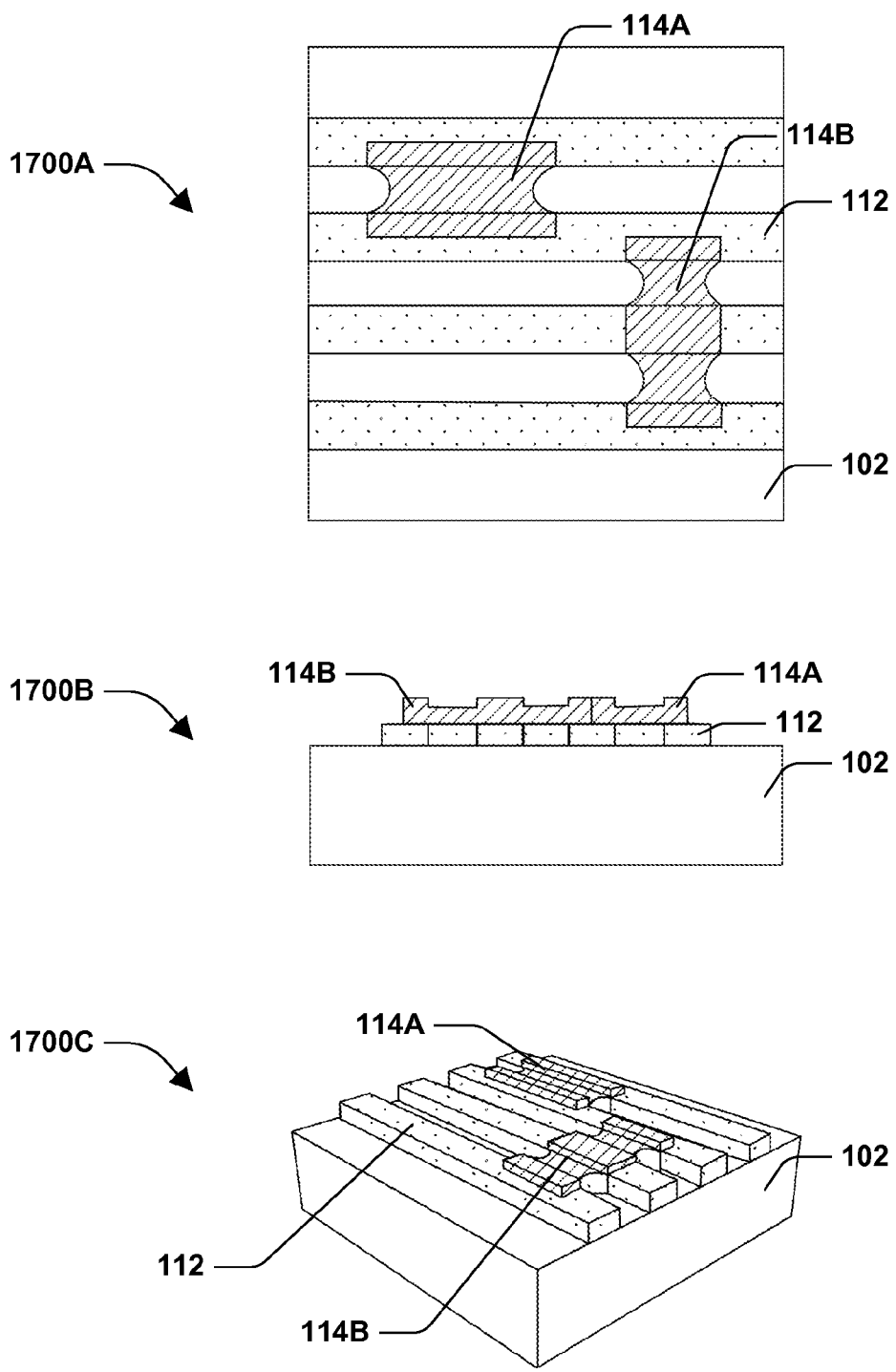
FIG. 17 illustrates various views of an example line end space structure during formation, according to some embodiments.

FIG. 17 illustrates various views of an example line end space structure during formation, according to some embodiments. For example, 1700A is a top-down view of an example line end space structure during formation, according to some embodiments. In some embodiments, at least some of at least one of the spacer region 150, the second sacrificial HM region 134, the first HM region 112, or the first sacrificial HM region 132 is removed. For example, the spacer region 150 and the second sacrificial HM region 134 are removed. Additionally, at least some of the first HM region 112 not associated with or covered by the first sacrificial HM region 132 is removed. In some embodiments, the first sacrificial HM region 132 is removed. Accordingly, at least one of the first patterned second HM region 114A, the second patterned second HM region 114B, the first HM region 112, or the base region 102 is exposed. In some embodiments, at least some of at least one of the first HM region 112 not associated with at least one of the patterned second HM regions is removed. For example, at least some of the first HM region 112 not associated with the first patterned second HM region 114A is removed. In some embodiments, at least some of the first HM region 112 not associated with the second patterned second HM region 114B is removed. In this manner, a thickness associated with at least some of the first HM region 112 is reduced. Additionally, 1700B is a cross-sectional view of an example line end space structure during formation, according to some embodiments. In some embodiments, at least some of the first HM region 112 is above at least some of the base region 102, and at least some of at least one of the first patterned second HM region 114A or the second patterned second HM region 114B is above at least some of the first HM region 112. Additionally, FIG. 1700C is a perspective view of an example line end space structure during formation, according to some embodiments.

Figure 18:
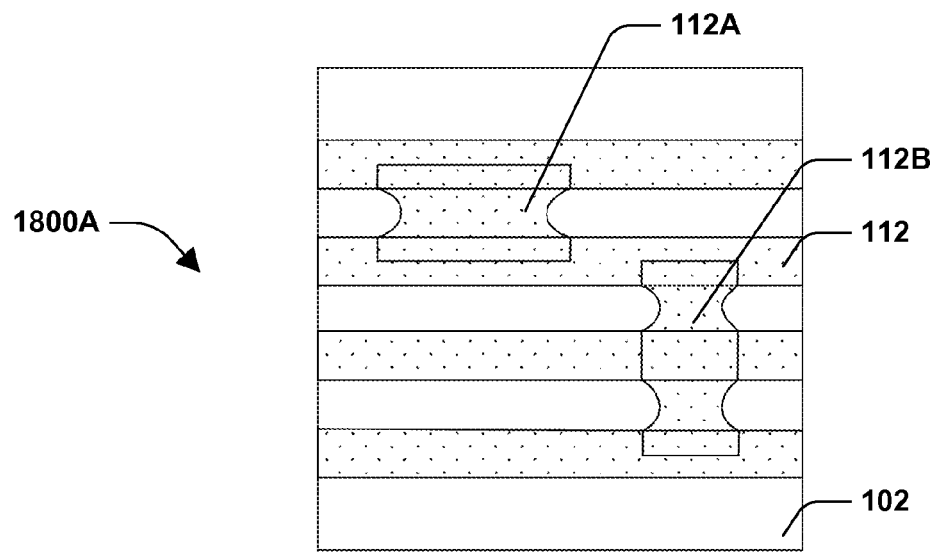
FIG. 18 illustrates various views of an example line end space structure during formation, according to some embodiments.
Figure 18:
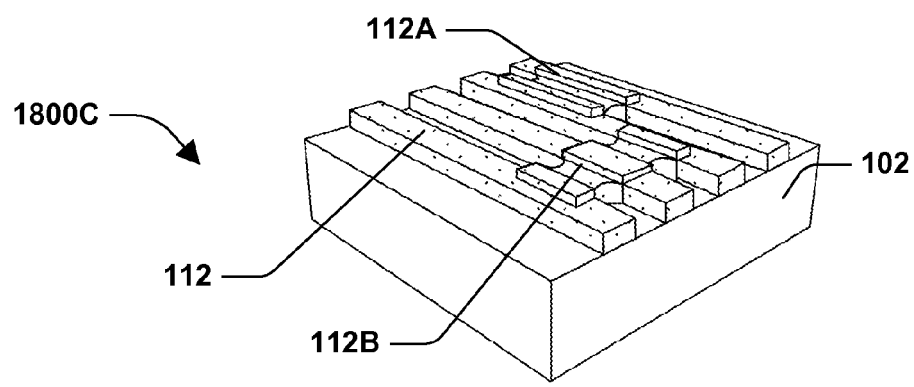

FIG. 18 illustrates various views of an example line end space structure during formation, according to some embodiments. For example, 1800A is a top-down view of an example line end space structure during formation, according to some embodiments. In some embodiments, 112A is a first line end space structure and 112B is a second line end space structure. For example, at least one of the first line end space structure 112A or the second line end space structure 112B is formed by removing patterned second HM regions. For example, at least one of the first patterned second HM region 114A or the second patterned second HM region 114B is removed. Additionally, FIG. 1800C is a perspective view of an example line end space structure during formation, according to some embodiments.

Figure 19:
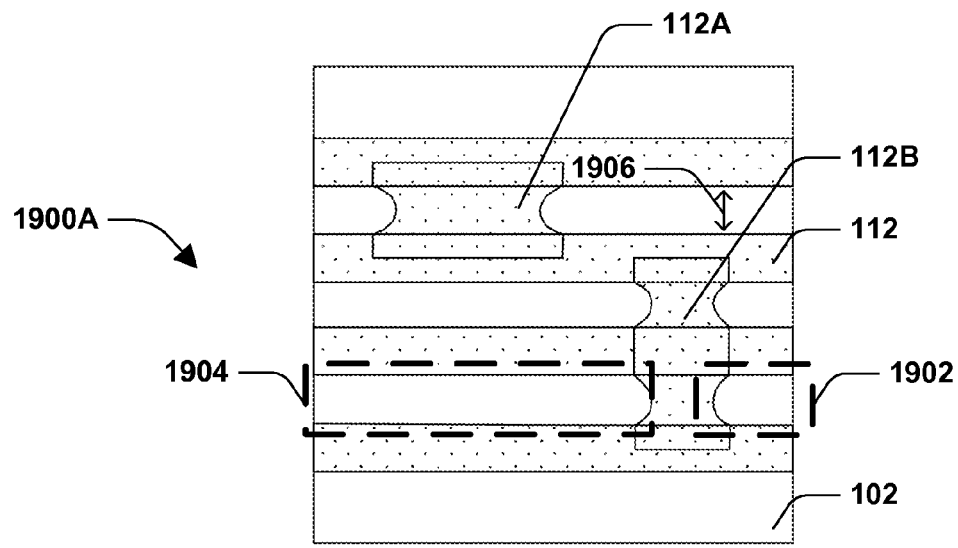
FIG. 19 illustrates various views of an example line end space structure during formation, according to some embodiments.
Figure 19:
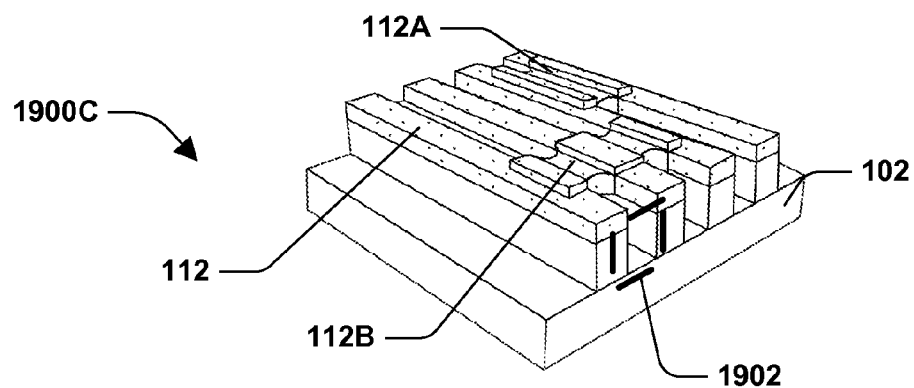

FIG. 19 illustrates various views of an example line end space structure during formation, according to some embodiments. For example, 1900A is a top-down view of an example line end space structure during formation, according to some embodiments. In some embodiments, at least some of the base region 102 not associated with the first HM region 112 is removed. For example, base region 102 not covered by the first HM region 112 is removed, such as at 1902. In some examples, a portion of base region 102 is removed at 1902, at least because the first HM region 112 does not cover 1902. In some embodiments, the second line end space structure 112B is configured to separate a first metal line at 1904 from a second metal line at 1902. It will be appreciated that the first line end space structure 112A is configured to separate one or more metal lines in a similar fashion. For example, a first metal line is formed on a first side of a line end space structure 112B, such as at 1904. Additionally, a second metal line is formed on a second side of the line end space structure 112B, such as at 1902. Additionally, FIG. 1900C is a perspective view of an example line end space structure during formation, according to some embodiments. In some embodiments, one or more metal lines are formed within one or more portions of the base region 102 not associated with the first HM region 112.

Figure 20:
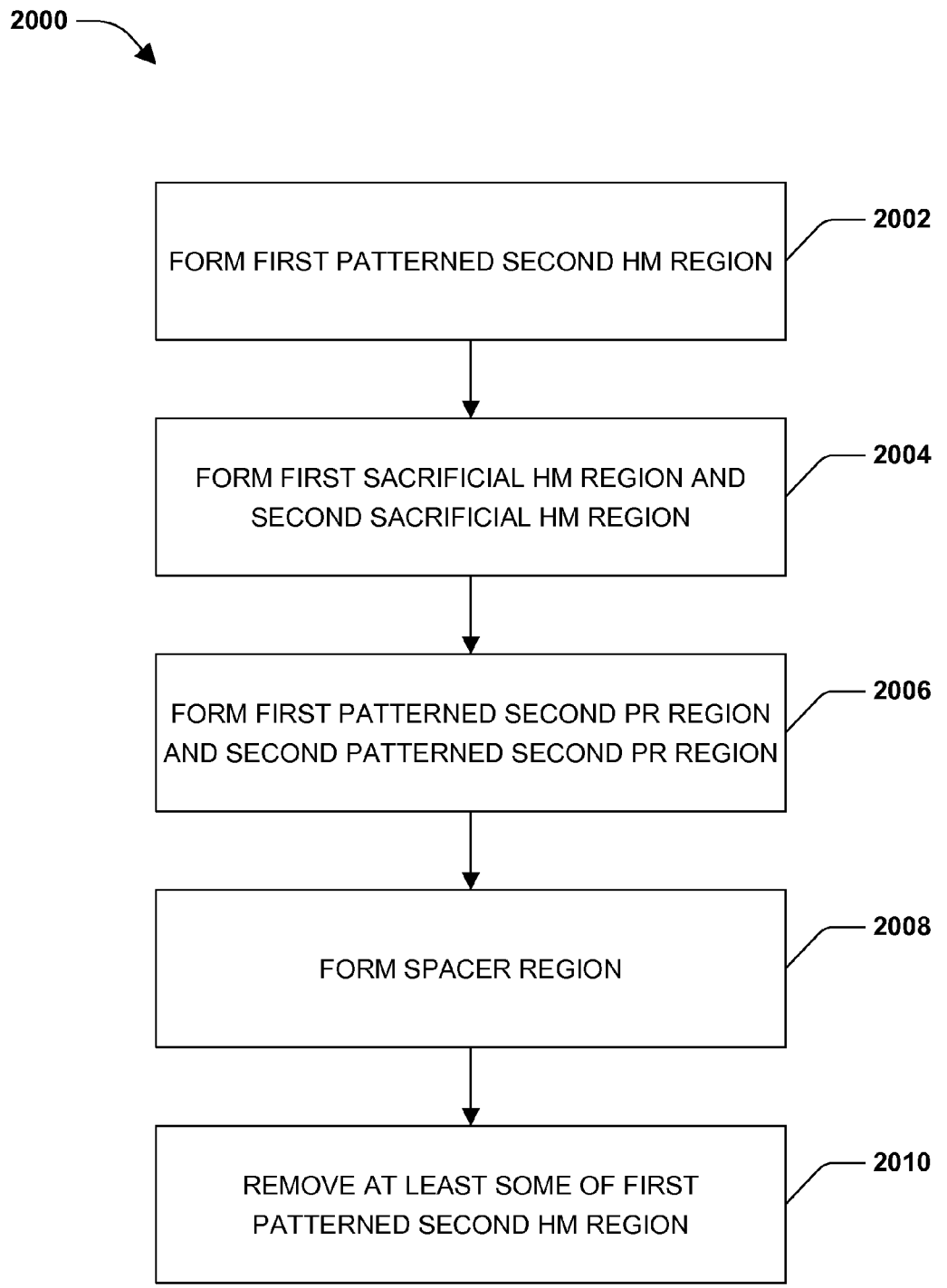
FIG. 20 is a flow diagram of an example method for forming a line end space structure, according to some embodiments.

FIG. 20 is a flow diagram of an example method 2000 for forming a line end space structure, according to some embodiments. At 2002, the method 2000 comprises forming a first patterned second HM region. At 2004, a first sacrificial HM region and a second sacrificial HM region are formed. At 2006, a first patterned second PR region and a second patterned second PR region are formed. At 2008, a spacer region is formed. At 2010, at least some of the first patterned second HM region is removed.

Figure 21:
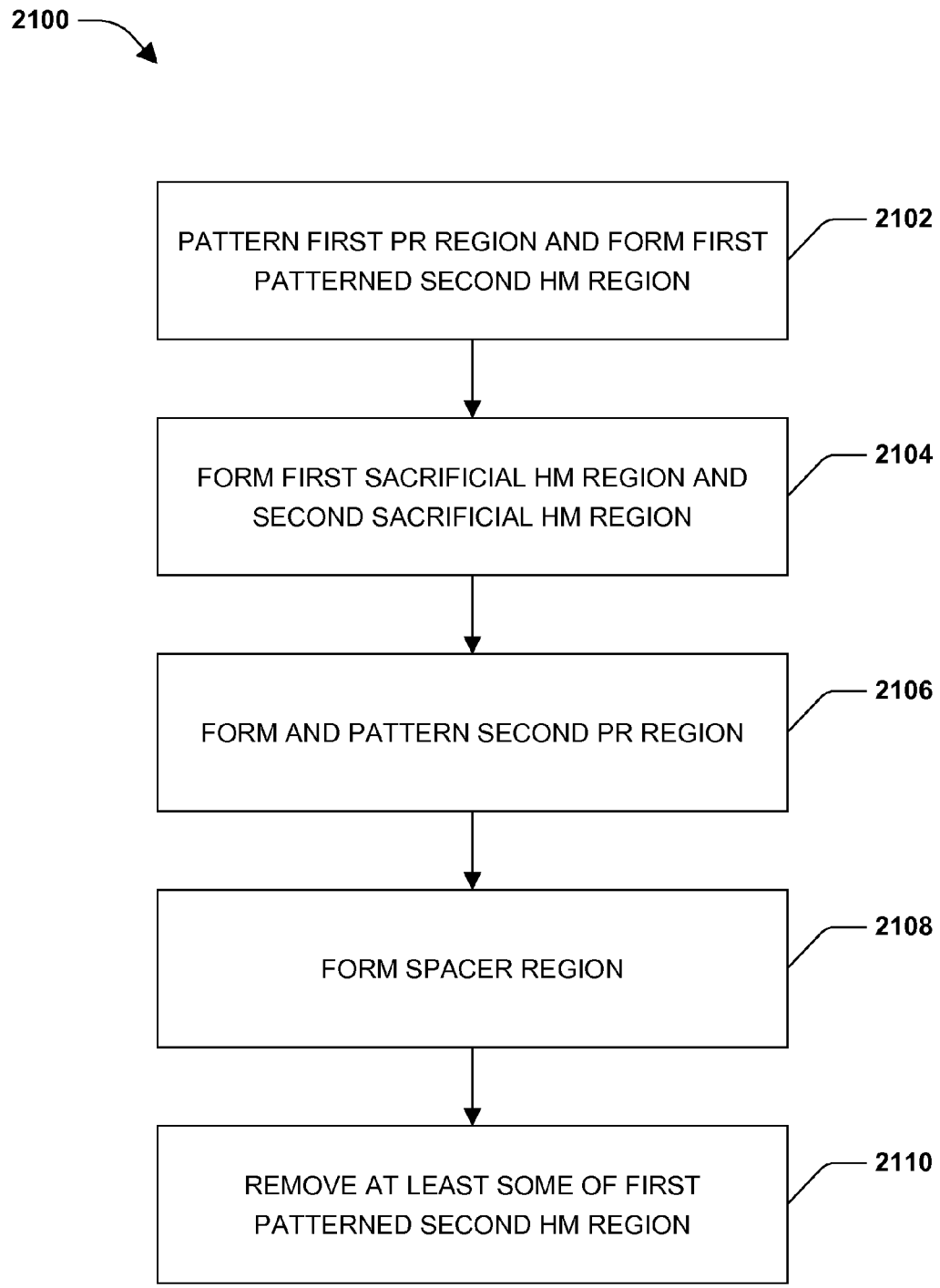
FIG. 21 is a flow diagram of an example method for forming a line end space structure, according to some embodiments.

FIG. 21 is a flow diagram of an example method 2100 for forming a line end space structure, according to some embodiments. At 2102, the method 2100 comprises patterning a first photo resist (PR) region to form a first patterned first PR region associated with a first pattern location and forming a first patterned second hard mask (HM) region associated with the first pattern location based on the first patterned first PR region. At 2104 the method 2100 comprises forming a first sacrificial HM region and a second sacrificial HM region. At 2106, a second PR region is formed and patterned. At 2108, a spacer region is formed. At 2110, at least some of the first patterned second HM region is removed.

Figure 22:
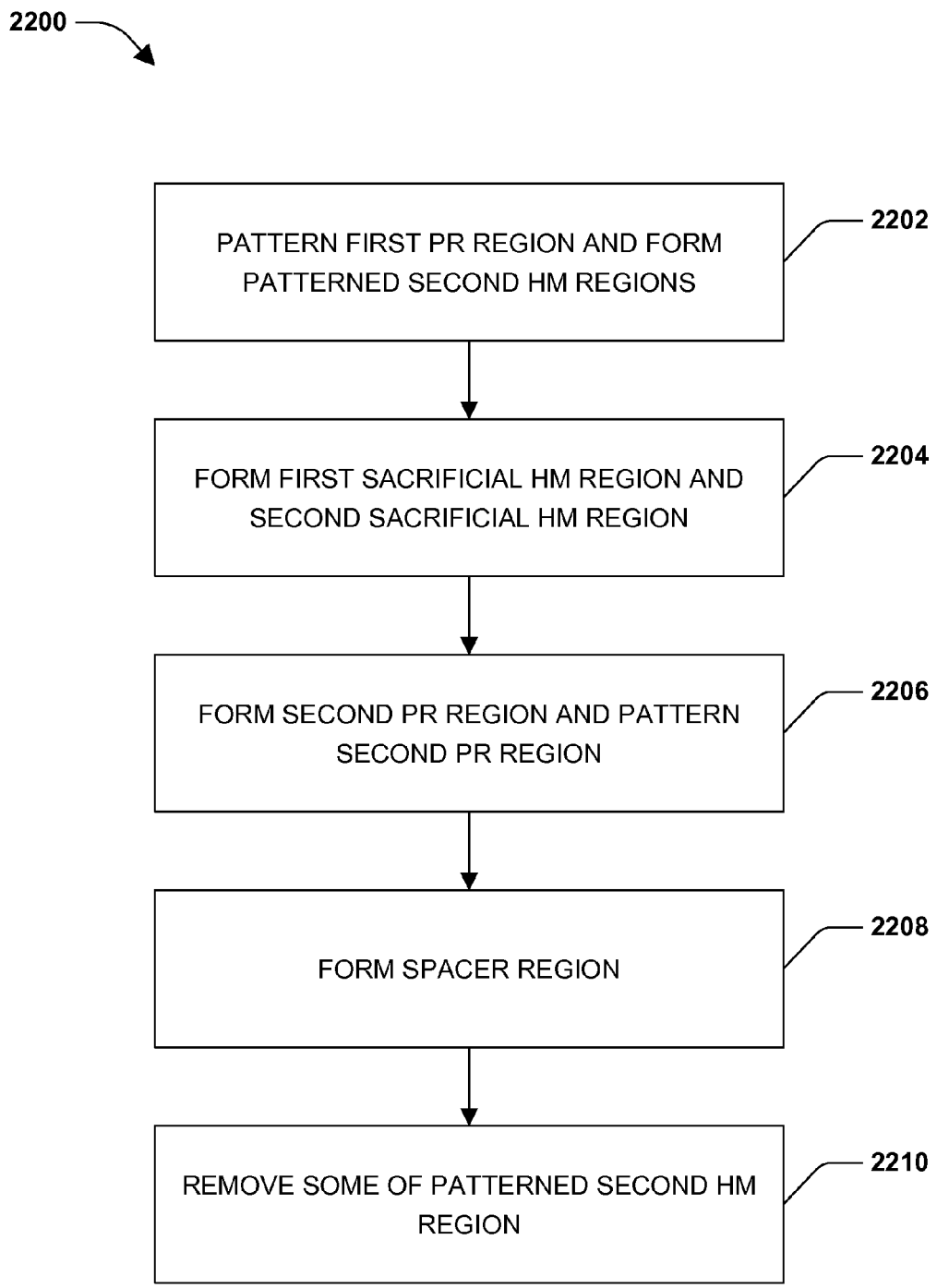
FIG. 22 is a flow diagram of an example method for forming a line end space structure, according to some embodiments.

FIG. 22 is a flow diagram of an example method 2200 for forming a line end space structure, according to some embodiments. At 2202, a first PR region is patterned and one or more patterned second HM regions are formed. At 2204 a first sacrificial HM region and a second sacrificial HM region are formed. At 2206, a second PR region is formed and patterned. At 2208, a spacer region is formed. At 2210, at least some of a patterned second HM region is removed.

One or more techniques or systems for forming a line end space structure are provided herein. In some embodiments, a line end space structure is formed at a back end of the line (BEOL). In some embodiments, an end-to-end (EE) space pattern is formed first, for example. In some embodiments, a second hard mask (HM) region associated with a line end space structure is patterned. In some embodiments, the second HM region is above a first HM region. Additionally, sacrificial HM regions are formed above at least some of the patterned second HM region. Spacers are formed above at least one of the sacrificial HM regions to facilitate metal line formation. Accordingly, respective sacrificial HM regions are removed to expose the patterned second HM region. In some embodiments, the patterned second HM region is trimmed, thus reducing an EE space associated with the trimmed patterned second HM region. In this way, a line end space structure is formed, based on the patterned second HM region.

According to some aspects, a method for forming a line end space structure is provided, comprising forming a first patterned second hard mask (HM) region associated with a first pattern location based on a first patterned first photo resist (PR) region. In some embodiments, the method comprises forming a first sacrificial HM region above at least some of at least one of the first patterned second HM region or a first HM region. In some embodiments, the method comprises forming a second sacrificial HM region above at least some of the first sacrificial HM region. In some embodiments, the method comprises forming at least one of a first patterned second PR region or a second patterned second PR region above at least some of the second sacrificial HM region, the first patterned second PR region associated with a first line location, the second patterned second PR region associated with a second line location. In some embodiments, the method comprises forming a spacer region above at least some of at least one of the first patterned second PR region, the second patterned second PR region, or the second sacrificial HM region. In some embodiments, the method comprises removing at least some of the first patterned second HM region.

According to some aspects, a method for forming a line end space structure is provided, comprising patterning a first photo resist (PR) region to form a first patterned first PR region associated with a first pattern location. In some embodiments, the method comprises forming a first patterned second hard mask (HM) region associated with the first pattern location based on the first patterned first PR region. In some embodiments, the method comprises forming a first sacrificial HM region above at least some of at least one of the first patterned second HM region or a first HM region. In some embodiments, the method comprises forming a second sacrificial HM region above at least some of the first sacrificial HM region. In some embodiments, the method comprises forming a second PR region above at least some of the second sacrificial HM region. In some embodiments, the method comprises patterning the second PR region. In some embodiments, the method comprises forming a spacer region above at least some of at least one of the patterned second PR region or the second sacrificial HM region. In some embodiments, the method comprises removing at least some of the first patterned second HM region.

According to some aspects, a method for forming a line end space structure is provided, comprising patterning a first photo resist (PR) region to form one or more patterned first PR regions, respective patterned first PR regions associated with one or more pattern locations. In some embodiments, the method comprises forming one or more patterned second hard mask (HM) regions associated with respective pattern locations based on respective patterned first PR regions. In some embodiments, the method comprises forming a first sacrificial HM region above at least some of at least one of a first HM region or at least one of the patterned second HM regions. In some embodiments, the method comprises forming a second sacrificial HM region above at least some of the first sacrificial HM region. In some embodiments, the method comprises forming and patterning a second PR region above at least some of the second sacrificial HM region. In some embodiments, the method comprises forming a spacer region above at least some of at least one of the second sacrificial HM region or the patterned second PR regions. In some embodiments, the method comprises removing at least some of at least one of the patterned second HM regions.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

It will be appreciated that layers, features, regions, elements, such as the base region, first hard mask (HM) region, second HM region, first photo resist (PR) region, first patterned first PR region, first patterned second HM region, first sacrificial HM region, second sacrificial HM region, second PR region, first patterned second PR region, second patterned second PR region, spacer region, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, features, regions, elements, etc. mentioned herein, such as implanting techniques, etching techniques, doping techniques, spin-on techniques, such as spin coating, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A method for forming a line end space structure, comprising:
    forming a first patterned second hard mask (HM) region associated with a first pattern location based on a first patterned first photo resist (PR) region;
    forming a first sacrificial HM region above at least some of the first patterned second HM region;
    forming a second sacrificial HM region above at least some of the first sacrificial HM region;
    forming at least one of a first patterned second PR region or a second patterned second PR region above at least some of the second sacrificial HM region, the first patterned second PR region associated with a first line location, the second patterned second PR region associated with a second line location;
    forming a spacer region above at least some of at least one of the first patterned second PR region, the second patterned second PR region, or the second sacrificial HM region; and
    removing at least some of the first patterned second HM region after the forming a spacer region.

2. The method of claim 1, comprising:
    forming a first PR region above at least some of a second HM region; and
    patterning the first PR region to form the first patterned first PR region.

3. The method of claim 2, the forming a first PR region comprising forming the first PR region based on spin coating.

4. The method of claim 1, the forming a first sacrificial HM region comprising forming the first sacrificial HM region to surround at least some of the first patterned second HM region.

5. The method of claim 1, the forming at least one of a first patterned second PR region or a second patterned second PR region comprising:
    forming a second PR region above at least some of the second sacrificial HM region; and
    patterning the second PR region to form at least one of the first patterned second PR region or the second patterned second PR region.

6. The method of claim 5, the forming a second PR region comprising forming the second PR region based on spin coating.

7. The method of claim 1, the forming a spacer region comprising forming the spacer region based on deposition.

8. The method of claim 1, comprising removing at least some of the spacer region associated with a third line location, the third line location between the first patterned second PR region and the second patterned second PR region.

9. The method of claim 1, the removing comprising removing at least some of the first patterned second HM region based on an anisotropic etch.

10. The method of claim 1, comprising removing at least some of a base region.

11. The method of claim 1, comprising forming the first patterned first PR region to comprise a width associated with a distance greater than a width of a metal line and a length associated with an end-to-end (EE) space for a line end space structure.

12. The method of claim 1, at least one of:
    the forming a first sacrificial HM region comprising forming the first sacrificial HM region based on at least one of spin coating, chemical vapor deposition (CVD), plasma enhanced chemical vapor deposition (PECVD), or atomic layer deposition (ALD); or
    the forming a second sacrificial HM region comprising forming the second sacrificial HM region based on at least one of spin coating, CVD, PECVD, or ALD.

13. The method of claim 1, the forming a first patterned second HM region comprising forming the first patterned second HM region based on at least one of chemical vapor deposition (CVD), physical vapor deposition (PVD), plasma enhanced chemical vapor deposition (PECVD), or atomic layer deposition (ALD).

14. The method of claim 1, the forming a spacer region comprising forming the spacer region based on at least one of chemical vapor deposition (CVD) or atomic layer deposition (ALD).

15. A method for forming a line end space structure, comprising:
    patterning a first photo resist (PR) region to form a first patterned first PR region associated with a first pattern location;
    forming a first patterned second hard mask (HM) region associated with the first pattern location based on the first patterned first PR region;
    forming a first sacrificial HM region above at least some of at lest one of the first patterned second HM region;
    forming a second sacrificial HM region above at least some of the first sacrificial HM region;
    forming a second PR region above at least some of the second sacrificial HM region;
    patterning the second PR region to form a patterned second PR region;

forming a spacer region above at least some of at least one of the patterned second PR region or the second sacrificial HM region; and removing at least some of the first patterned second HM region after the forming a spacer region.

16. The method of claim 15, comprising forming one or more metal lines within one or more portions of a base region below the first patterned second HM region.

17. The method of claim 15, comprising:
forming a first metal line on a first side of a first line end space; and
forming a second metal line on a second side of the first line end space.

18. The method of claim 15, comprising forming the first PR region based on spin coating.

19. The method of claim 15, the forming a spacer region comprising forming the spacer region based on deposition.

20. A method for forming a line end space structure, comprising:

patterning a first photo resist (PR) region to form a patterned first PR region, the patterned first PR region associated with a pattern location;

forming a patterned second hard mask (HM) region associated with the pattern location based on the patterned first PR region;

forming a first sacrificial HM region above at least some of the patterned second HM region;

forming a second sacrificial HM region above at least some of the first sacrificial HM region;

forming and patterning a second PR region above at least some of the second sacrificial HM region to form a patterned second PR region;

forming a spacer region above at least some of at least one of the second sacrificial HM region or the patterned second PR region; and removing at least some of the patterned second HM region after the forming a spacer region.

* * * * *